United States Patent
Watatani

(10) Patent No.: US 6,602,748 B2
(45) Date of Patent: Aug. 5, 2003

(54) METHOD FOR FABRICATING A SEMICONDUCTOR DEVICE

(75) Inventor: Hirofumi Watatani, Suzuka (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/121,842

(22) Filed: Apr. 15, 2002

(65) Prior Publication Data

US 2002/0110982 A1 Aug. 15, 2002

Related U.S. Application Data

(62) Division of application No. 09/865,679, filed on May 29, 2001.

(30) Foreign Application Priority Data

May 26, 2000 (JP) ........................................ 2000-156773

(51) Int. Cl.[7] .......................................... H01L 21/8242
(52) U.S. Cl. ..................................... 438/239; 438/381
(58) Field of Search ................................ 438/239, 243, 438/250, 253, 259, 381, 393, 396, 672, 675, 680, 681, 692, 773, 775, 791

(56) References Cited

U.S. PATENT DOCUMENTS 6,228,781 B1 * 5/2001 Murugesh et al. .......... 438/784

* cited by examiner

Primary Examiner—Viet Q. Nguyen
Assistant Examiner—David Nhu
(74) Attorney, Agent, or Firm—Staas & Halsey LLP

(57) ABSTRACT

A low temperature film deposition process fills fine gaps while avoiding removal of the deposited film in post-processes, and is applicable to formation of semiconductor devices having both sparse and dense patterned regions, such as a combined logic and memory hybrid semiconductor device. A thermal CVD (chemical vapor deposition) method is performed at a first pressure to form a first insulation film on a main surface of a substrate having patterned recesses therein and, after the recesses are substantially filled, a second thermal CVD process is performed under a second pressure, lower than the first pressure and without interruption of the supply of the film forming gas during the transition from the first to the second process, thereby to form an insulation film continuously and without a barrier layer therebetween. The insulation film material may include both boron and phosphor and may be formed by an alcoxylane saline and an alcoxyl compound of a conductive impurity and ozone under a growth pressure of 600 Torr or higher in the first process and a growth pressure of 600 Torr or lower in the second process. The insulation film may be subject to reflow annealing in a vapor-including atmosphere.

13 Claims, 18 Drawing Sheets

METHOD FOR FABRICATING A SEMICONDUCTOR DEVICE

This application is a divisional of application Ser. No. 09/865,679, filed May 29, 2001, now pending.

CROSS-REFERENCE TO RELATED APPLICATIONS

This application is based upon and claims priority of Japanese Patent Application No. 2000-156773 filed May 26, 2000, the contents thereof being incorporated herein by reference.

BACKGROUND OF THE INVENTION

1. Field of the Invention

The present invention relates to a semiconductor device fabricating method and, more particularly, to a semiconductor device fabricating method for forming an insulation film on an entire main surface of a substrate for the device, including an uneven, patterned surface portion of the main surface.

2. Discussion of the Related Art

With reference to FIGS. 1A through 8, sequential steps of a method of fabricating a DRAM/logic hybrid type semiconductor device of the related art (in the following explanation, a DRAM/logic hybrid type semiconductor device will be termed merely as a "hybrid type semiconductor device" or a "DRAM & logic device") are explained and the problem mentioned above, of forming a film on an uneven, patterned surface, is explained from a practical standpoint.

FIGS. 1A and 1B are cross-sectional views of structures produced at successive steps a and b, respectively, in the course of fabricating a hybrid type semiconductor device in accordance with a method of the related art. In step a and as shown in FIG. 1A, n-type wells 5 and 6 are formed within active regions 3 and 4, respectively, defined within an element isolating insulation film 2 on a major surface of a silicon substrate 1, the p-type well 7 being formed within the n-type well 6. Moreover, gate electrodes 10, 11, 12 and 13 of corresponding MOS transistors are formed within respective active regions 3 and 4 of the common silicon substrate 1 by sequentially laminating thereon a polysilicon film (10a, 11a, 12a and 13a), a tungsten silicide film (10b, 11b, 12b and 13b) and a silicon nitride film (10c, 11c, 12c and 13c) and then patterning same. Respective source/drain regions 15 and 16 of respective MOS transistors in the active regions 4 and 3 are formed to a shallow depth within the corresponding n-type and p-type wells 6 and 7. On the left and right side of the drawings, relatively to the center, there are schematically illustrated a DRAM part active region 3 and a logic device part active region 4, respectively.

Next, in step b and as shown in FIG. 1B, a silicon nitride film 20 is formed so as to cover the entire surface of the DRAM part active region 3 (left side of figure) and the logic device part active region 4 (right side of FIG. 1B) including the surfaces of gate electrodes 10, 11, 12, 13. The DRAM part active region 3 subsequently is covered with a resist (not shown). The logic active part 4 (right side of FIGS. 1A and 1B) is not covered with the resist and instead is exposed. The silicon nitride film 20 is removed, through an etch-back step using a dry etching process, and a residue thereof designated at 25 on the side surfaces of the gate electrode 10 of the Logic device part 4 is used as a side wall spacer. Thereafter, using the remaining resist, ion implantation is performed for producing diffused source/drain regions 26 in the substrate surface of the Logic device part 4 (right side of FIGS. 1A and 1B). Lastly, the resist used as the mask is removed to provide the structure illustrated in FIG. 1B.

Subsequently, in step c and as shown in FIG. 2A, a cobalt silicide (CoSi) film 30 is formed, using a self-alignment method, selectively on the surface of the source/drain region 15 of the Logic device part 4. Thereafter, a silicon nitride film 33, that is used as a stopper for opening of contact windows, as a post-process, is formed by deposition on the entire surface of the substrate 1, to provide the structure illustrated in FIG. 2A.

In step d and as shown in FIG. 2B, when a BPSG film 35 is formed on the silicon nitride film 33 by a CVD (chemical vapor deposition) method, voids 34 tend to be generated therein, in the portions following the gaps between adjacent gate electrodes 11 and 12 and 12 and 13, because the gate electrode interval (i.e., the spacing between adjacent gates) is small, like a slit, in the DRAM part 3 (left side in the figure).

Subsequently, in step e and as shown in FIG. 3A, the voids 34 are eliminated through reflow annealing of the BPSG film 35. The BPSG film 35 is known to have a merit that it will easily reflow at a comparatively low temperature; however, annealing at 800° C. or higher is required to definitely eliminate the voids 34. This temperature will be explained in more detail when explaining the problem of this process.

Next, in step f as shown in FIG. 3B, contact holes 36, 37 are opened in the BPSG film 35 by a dry etching method in such a manner so as to reach the regions 16 of DRAM device active region 3 of the substrate 1; further, respective contact electrodes 40, 41, consisting of conductive material, are formed within these contact holes 36, 37.

Moreover, in step g and as shown in FIG. 4, a silicon oxide ($SiO_2$) film 45, of a constant, or uniform, thickness, is formed on the entire surface of film 35 and a film 46 is then formed on film 45 by sequentially laminating titanium and titanium nitride layers thereon. Bit lines 47 are then formed, extending through respective patterned openings, or windows, 45' for electrical connection with the (polysilicon) contact electrodes 40, 41 which extend through respective openings 36 and 37 in the BPSG film 35.

Moreover, in step h, as shown in FIG. 5, a silicon nitride film 49 is deposited on the entire surface of the substrate 1, including the surface of the bit line 47 and film 45. Next, a plasma oxide film 48 is deposited on the bit line 47 by a plasma CVD (chemical vapor deposition) method; the plasma CVD step, however, cuts, or abrads, the silicon nitride film 49 by a sputtering effect of argon gas, and thereby titanium is exposed to the plasma during the plasma CVD process. Accordingly, the exposed surface of titanium is oxidized and titanium oxide 44 is formed, as illustrated in FIG. 5. Subsequently, a further plasma oxide film 48 is deposited so as to cover the entire surface.

Subsequently, in step i and as shown in FIG. 6, a deep contact window 48' is opened in the plasma oxide film 48, using a dry etching method, to expose the surface of the contact electrode 41, which is not connected with the bit line 47; further, an amorphous silicon plug 50 is formed so as to fill the contact window 48'.

Next, in step j and as illustrated in FIG. 7, a memory cell capacitor is formed in connection with the amorphous silicon plug 50. In this process, a conductive layer is formed on the entire surface of the plasma oxide film 48 and is then patterned to form the storage electrode 51; thereafter, a dielectric material layer is formed on the entire surface, including that of the storage electrode 51, which is then patterned to form the storage layer 52 and a storage electrode layer then is formed on the entire surface and patterned to form an opposing electrode 53, thereby to complete the memory cell capacitor structure. Subsequently, a sufficiently thick plasma oxide silicon film 58 is formed on the entire surface, including that of the memory cell capacitor structure. Thereby, the structure of FIG. 7 is completed.

Next, a metal multilayer-wiring layer forming process is performed, in step k illustrated in FIG. 8. A deep contact window 60 is opened, extending from the surface of the plasma oxide silicon film 58, deposited in the preceding process step j, to the logic device part 4 (right side of the figure). The contact window 60 can be opened by a well-known method combining dry etching with photolithography. After the opening process, a thin barrier metal layer 61 is deposited on the internal bottom and sidewall surfaces of window 60 in such a manner so as to extend up to the external surface of the plasma oxide silicon film 58 and, further, a conductive film 62 (e.g., tungsten) is embedded to form, with the layer 61, both a plug 63 filling the hole 60 and a wiring layer on the surface.

The processes explained above are a summary of the related art. This related art suffers from several problems.

First, in the deposition and forming process of the BPSG film 34 of step d, explained with reference to FIG. 2B, it is attempted to reduce as much as possible the voids, from the initial stage of the film formation, by setting the pressure to a higher value in the course of the film formation process; however, it is known that when the pressure is set to a higher value, the film formation rate is reduced and thus it is impossible to apply, to a mass-production system, the formation of the BPSG film 34 as a thick interlayer insulation film, since the low film formation rate causes the productivity to be too low. Conversely, if the film formation rate is set to a higher value from the beginning, in order to apply this method to a mass-production system, it is considered that the remaining voids can be eliminated, to a large extent, with a sufficient reflow annealing process; however, this is not preferable, because introducing such a sufficient reflow annealing of the BPSG film 35 results in creating the following, different problems.

As one problem, an etch stopper at the time of executing the dry etching step for window opening in the post-process, a nitride film is often used; however, when the BPSG films are arranged at the immediately upper and lower sides of the nitride film and these films are in contact with each other, a stress difference of both BPSG films, relative to the nitride film, is large and the stress is stored in both films and thereby cracks and defects, such as bubbles, are generated in both films.

It is also known that cracks are generated in the plasma nitride silicon film when the BPSG film is placed in direct with the plasma nitride silicon film. Accordingly and as a measure for preventing such generation of cracks, when the BPSG film and the plasma nitride silicon film are sequentially laminated, a buffer film is formed at the interface. However, when the BPSG film, buffer film, and plasma nitride silicon film are sequentially formed, the resulting multi-layer film, as a whole, becomes compressive, namely, a compression stress of the film results and, thereby, the center area of film is deflected, swelling somewhat to the upper side. When heat is applied subsequently to this multi-layer film structure, the film as a whole generates a tensile stress and thereby the center area is deflected, swelling somewhat to the lower side. In this case, the BPSG film is reflowed in a heating atmosphere during a reflow annealing step. Subsequently, when the multi-layer structure is cooled to the initial temperature, a tensile stress is generated in the plasma nitride silicon film while the temperature is decreasing, generating a compressive stress in the BPSG film and, thereby, a large stress difference is also generated in the BPSG film. The stress generated during such heating and cooling processes tends to be increased by the presence of the buffer film and, therefore, bubbles are generated within the BPSG film while hardening the BPSG film from a softened state, resulting in the problem that such bubbles remain as a residue within the film while cooling down the film.

As another problem, long-term reflow annealing provides an adverse effect of causing impurity diffusion into the active areas, such as the gate electrode and the like. In the case of a shallow and wide contact window having an aspect ratio (depth to width ratio) of 1 or less, the BPSG film can generally be embedded adequately, and thus without requiring a high temperature reflow annealing for the purpose of eliminating voids, and when heating is conducted at a temperature of about 700° C. in order to obtain a dense film structure, the film can be used directly as an interlayer insulation film. However, with improvements in (i.e., increases in the extent of) miniaturization and integration of devices, it is inevitable that deeper and narrower contact windows having an aspect ratio of 1 or larger are required and, thus, longer reflow annealing processes must be conducted in order to eliminate the voids. Simultaneously, since the area of the element, itself, that has generated unwanted impurity diffusion is also ultra-miniaturized, the adverse effects of impurity diffusion, due to the reflow annealing, are extremely increased.

The problems caused by reflow annealing, explained above, have been considered with a view to eliminate the problems so as to gradually execute the embedding under a higher pressure thereby to make the voids smaller until completion of the embedding of the recess and thereafter to deposit the film at a higher deposition rate under a lower pressure for forming a sufficiently thick film. However, if such a method is introduced for formation of an insulation film including a conductive impurity, such as the BPSG film, by the thermal CVD method, a clear boundary layer is formed at the boundary of the first film, formed under the high pressure process, and the second film, formed later under the low pressure process, in the course of producing the BPSG film. After such a boundary layer is formed, a contact window is opened to the BPSG film, which will become the interlayer insulation film, in order to lay the wiring which is formed to electrically connect the active area in the substrate under the BPSG film; however, the button surface of the window is exposed once to the etchant for surface cleaning to conduct the light wet etching in place of depositing the wiring layer within the contact window. The etchant used in this process penetrates into the boundary layer from the side surface, or edges, of the window and thereby the film tends to be removed later.

For instance, the reflow preferably can be conducted even under a comparatively lower temperature when the BPSG film is formed under a water vapor atmosphere; however, when an annealing process is conducted under a water vapor atmosphere, if a high melting point metal such as tungsten or the like is used as a part of the film, and to prevent oxidation at the surface by the vapor, it is necessary to provide a liner film consisting of a low pressure CVD-silicon nitride film having relatively a higher moisture-proof characteristic (LP-CVD SiN film). However, when a silicon nitride film having a relatively higher dielectric coefficient is provided between the bit lines, it is likely to deteriorate in high-speed operations because a capacitance between the bit lines is increased. Further, there arises a problem in that the liner film, consisting of the silicon nitride film, will interfere with the formation of an idealistic opening of a narrow contact window, resulting in a difficulty, from a technical viewpoint, in simple employment of the process to form the BPSG film under water vapor atmosphere. If a silicon oxide film (HDP-$SiO_2$ film) is formed through high density plasma CVD method, instead of a BPSG film, then the silicon oxide film may be formed around or even below 500° C. However, in the fabricating process using a $SiH_4$—, $O_2$—, Ar-based growth gas, which is generally used to form an HDP-$SiO_2$ film, an inert gas such as Ar or the like, used for the film formation, is suddenly degasificated in the post-annealing process and the film may be removed at the interface with the metal material laminated at the upper part. From another point of view, it has also been considered to introduce a method, aiming at a low film formation temperature, by increasing an impurity concentration of a BPSG film; however, since the moisture absorbing characteristic of a BPSG film is enhanced by a high impurity concentration, the etchant used for the wet etching process, to eliminate a naturally oxidized film, is easily absorbed. As a result, a hydrate of phosphorus, called a "phosphorus ball", tends to be generated, resulting in the problem that the remaining phosphorus ball changes to a foreign matter that will probably generate pattern failure if such a phosphorus ball is not definitely eliminated, by simply using the wet etch solution processing step.

SUMMARY OF THE INVENTION

As explained in the above, the problem created by reflow annealing can be overcome by forming an insulation film, including a conductive impurity, in two steps with respective, different conditions; however, in this case, a boundary layer is also formed when the conditions are changed and the boundary layer presents the problem that the boundary layer may be removed in post-processes. When the reflow annealing is carried out a sufficiently long time, alterations of condition parameters are not required and the problem of the generation of a boundary layer can be eliminated; however, when annealing is performed for a long time, various problems, such as physical stress generation or unwanted impurity diffusion, may be generated in the films.

It is therefore an object of the present invention to provide an insulation film forming technique, suitable for mass-production, by which narrow gaps may be embedded in a desired shape, even if the insulation film includes a conductive impurity.

In accordance with a first embodiment of the present invention, a method of fabricating a semiconductor device comprises performing a first process, using a thermal CVD (chemical vapor disposition) method at a first pressure, to form a first insulation film on a main surface of a substrate having patterned recesses therein and, after the recesses are substantially filled with insulation film material deposited during the first process, performing a second process, using a thermal CVD (chemical vapor deposition) method under a second pressure, lower than the first pressure used in the first process, to form an insulation film sequentially and continuously, under a vacuum condition and without interruption of supply of the film forming gas during the transition from the first process to the second process.

In the first embodiment, the insulation film material may include both boron (B) and phosphorus (P). Moreover, the insulation film may be formed by an alcoxylane and an alcoxyl compound of a conductive impurity and ozone under a growth pressure of 600 Torr or higher in the first process and a growth process of 600 Torr or lower in the second process. Moreover, the insulation film is subjected to a reflow annealing in a vapor-including atmosphere. In addition, in forming the insulation film, the total concentration of boron (B) and phosphorus (P) in the growth film, in the first process of the method to form the insulation film, may be set to 24 mol % or higher.

In accordance with a second embodiment of the present invention, there is provided a method of fabricating a semiconductor device, comprising:

(1) depositing and forming a silicon-based insulation film including oxygen (i.e., an insulation film including silicon and oxygen) to fill gaps formed in an insulation film covering a gate electrode, a gate electrode side wall, a conductive layer and a field insulation film,
(2) forming a contact window within the insulation film to afford a substrate contact,
(3) embedding a contact electrode within the contact window,
(4) forming a silicon-based insulation film including nitrogen (i.e, an insulation film including silicon and nitrogen) on the contact electrode,
(5) forming an electrode including a high melting point metal on the silicon-based insulation film, and
(6) forming a further silicon-based insulation film, including oxygen, on the electrode using the high-density plasma CVD method employing a growth gas excluding any inert gas.

In the second embodiment, as explained above, a silicon-rich plasma oxide film having a stress of $-1.5\times10^9$ dyns/cm$^2$ or less and a refractive index of 1.5 or higher may be formed in the step (4). Moreover, in the step (5), an RTA (Rapid Thermal Annealing) process may be performed in a nitrogen atmosphere of 800° C. or lower, after etching to form the electrode or after washing by chemicals or water, as a post-etching process.

In accordance with a third embodiment, there is provided a method of fabricating a semiconductor device comprising the steps of forming, by patterning, a capacitor structure of a capacitor electrode and a capacitor insulation film and forming the silicon-based insulation film including oxygen, by a high density plasma CVD method, on the entire surface of the substrate including the capacitor structure surface in such a manner that the capacitor structure is embedded under the condition that the growth temperature is 500° C. or lower and an inert gas is not included in the growth gas.

The problem that a thin boundary layer is formed within an insulation film, including a conductive impurity and formed by the thermal CVD (chemical vapor deposition) method, in the case where a process condition is changed during formation of the film, such as a pressure is kept high at the time of filling a narrow gap for embedding but is lowered after completion of embedding, appears very distinctively in the insulation film including a conductive impurity, such as a BPSG film or a BSG film, and is serious in such a degree that penetration thereinto of a wet etchant will cause removal of the film. The cause of this problem is considered to be related to the circumstance that the composition ratio of a residue, or residual gas, when a gas supply is stopped, is different to a large extent from that of the gas as is supplied during film formation; it also can be assumed that an influence of the residual gas increases, in the circumstance of the complicated composition of the insulation film including a conductive impurity, such as a BPSG film and a BSG film. Moreover, in case of a plasma CVD method, if a high frequency power supply is turned off so that the plasma is no longer generated, the film forming condition is lost and, thereby, the boundary layer is never formed even when the residual gas exits. However, in the case of thermal CVD method, it is substantially impossible to shift to the non-film formation condition with a change of the other parameters before the supply of gas is stopped and, once the supply of gas is stopped, the boundary layer will be formed inevitably.

Therefore, the present invention prevents formation of a boundary layer by changing only the respective pressures used in the first and second processes of forming the first and second insulation layers while the gas, comprising the film forming material, is supplied continuously. Since a boundary layer is never formed, the etchant does not penetrate into the film when opening a window in a post-process and, accordingly, removal of the film does not occur.

According to the present invention, continuous growth of an insulation film including a conductive impurity, by continuous supply of a film forming gas under a pressure condition that the gas pressure initially is high and then is lowered, to cover a gap of a high aspect ratio of 4 or larger provided on an active region on a substrate, will avoid formation of a boundary layer which otherwise will result in the removal of film and, moreover, the gap may be filled precisely even if a long time reflow annealing is not performed. Thereby, adverse effects such as thermal stress, unwanted impurity diffusion or the like to the active region and other adverse factors affecting the element may be avoided and fabricating yield and reliability of exceedingly fine devices can be improved.

DETAILED DESCRIPTION

Figure 1A:
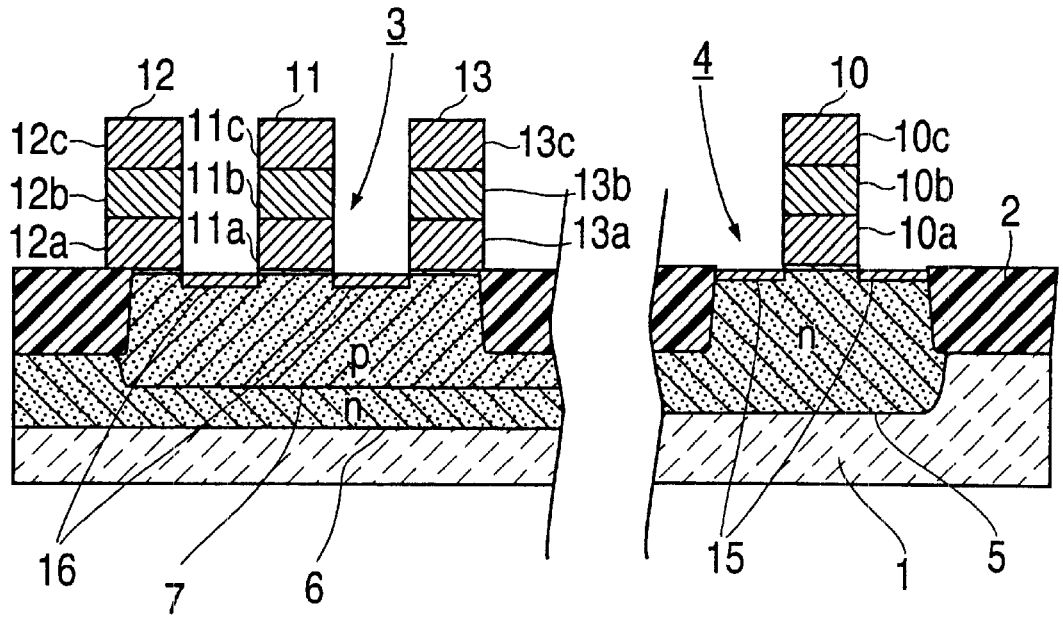
FIGS. 1A and 1B are cross-sectional views of a hybrid type semiconductor device of the related art at successive steps a and b of a fabricating process thereof.

The fabricating process of the invention will be explained in more detail with reference to FIGS. 9 through 17.

FIGS. 9 to 17 illustrate, in cross-sectional views, sequential structures of a hybrid type semiconductor device produced by an embodiment of the fabricating process of the present invention. In the present invention, as illustrated in FIGS. 9A through 17, when a BPSG film is formed in a gap, generation of voids in the respective gaps after the growth can be eliminated or controlled by setting the growth pressure in the first step to a pressure higher than 600 Torr, keeping the TEOS/O$_3$ ratio (i.e., gas flow ratio) high and allowing growth of the BPSG film to a thickness sufficient to fill the gap under a relatively slower growth rate condition. When the TEOS/O$_3$ ratio is set relatively high and growth rate is set relatively low, a condition similar to that of a surface reactive limitation can be attained and the film forming coverage can be improved. However, since the growth rate is rather slow in the above condition, in the second step the film is grown under the condition that the growth pressure is set lower than that in the first step, to improve the throughput and the growth rate is set relatively higher. Thereafter, reflow heating is performed and, in this case, a high temperature of 700° C. or more is required, for a gap having an aspect ratio of at least 4 or more, in annealing in a nitrogen and oxygen atmosphere. Therefore, the invention renders it possible to execute the embedding process, or step, through the reflow, at the temperature of 700° C. in an atmosphere including a water vapor content. It is believed that, in such an atmosphere, the BPSG film is subjected to reflow at a lower temperature because the OH-group in the water vapor content breaks down the network structure in the oxide film at the lower temperature. Moreover, in the case where the growth pressure in the first step is high and embedding is not performed under the condition that the growth rate is rather low, for a gap of aspect 4, a slit, or void, formed during and/or after the growth, becomes large and, further, voids are left in the case of reflow at a temperature of 750° C. or lower even in the case of a heating process performed in an atmosphere including water vapor content. If voids are generated, a short-circuit likely will be generated between the substrate and a contact plug. Therefore, for embedding in a gap of aspect 4 or larger, it is possible to simultaneously provide the continuous process of the growth condition and the condition for heating at 750° C. or lower in an atmosphere including water content. Through a combination of above, the process temperature can be lowered to 750° C. or less and diffusion of boron (B) into the gate oxide film can be controlled and variation of Vth (threshold value) characteristics can also be controlled.

In the case where a silicon nitride film is laminated, as an etch stopper, on a BPSG film, cracks may be generated in the nitride film due to the stress difference of the nitride film and the BPSG film. Therefore, a buffer film is required between the BPSG film and nitride film. In the case where an ordinary plasma oxide film is used as the buffer film, if a heat treatment is applied under a condition that the buffer film and the silicon nitride film are laminated on the BPSG film, the BPSG film absorbs a large amount of the stress of the silicon nitride film and, therefore, causes a failure, such as generation of a bubble in the BPSG film. Meanwhile, when the buffer film is formed of a silicon-rich plasma oxide film having a film stress of $-1.5 \times 10^9$ dyns/cm or less, generation of a failure, such as a bubble or a crack in the BPSG film after the heat treatment, can be controlled.

Moreover, the following secondary effects may be attained through application of the present invention to a hybrid device, such as a combined DRAM & logic device. In the case where bit wiring is formed by embedding conductive material within a contact window at a DRAM part, after the contact plug for providing an electrical connection to an active region of the substrate is provided, the electrical connection from the active region of the substrate is laid in general through the electrical connection via the contact hole to the upper contact plug. Therefore, in the DRAM part, it is initially not required to open a deep contact window, having a higher aspect ratio, to the active region of the substrate and thus avoiding an increased problem that the junction may leak, even when the etch stopper is not provided for the dry etching at the time of forming the opening. However, situations are somewhat different, as between the DRAM & Logic parts of a hybrid device, allowing coexistence of the DRAM and Logic device parts within the substrate.

In the hybrid device, when a silicide, such as cobalt silicide (CoSi) or the like, is used to reduce the resistance in the Logic device part, there arises a problem in that a contact resistance of cobalt silicide (CoSi) and a contact metal (e.g., a sequentially laminated film of Ti/TiN/W) increases, because of the reason that a long-term high temperature heat treatment is conducted in the capacitor fabrication process in the DRAM part, after the contact with the active region of the substrate when the bit line is formed. It is generally known that thermal stability of the contact with the cobalt silicide (CoSi) is rather low and, therefore, when a structure employing a stacked capacitor is introduced, a structure to afford contact with the active region of the substrate through a deep contact window is required. Since a contact window having a very high aspect ratio therefore must be formed, use of a silicon nitride film (SiN), as a stopper, is essential to prevent an increase of junction leakage due to the overetching at the cobalt silicide (CoSi) contact area. However, when the stopper is used, the gap of the DRAM becomes narrower because the SiN is also laminated at the DRAM part and embedding becomes more difficult. According to the present invention, even if the embedding condition is difficult, it is possible to avoid the accumulation of thermal stress resulting from high temperature treatment, as in the case of producing the DRAM & logic hybrid device, and a device having good characteristics can be completed without decreasing the fabrication yield.

With reference again to FIGS. 9–17, a method of fabricating a DRAM and logic hybrid device in accordance with the present invention, encompassing steps a through l, is now explained.

Figure 9A:
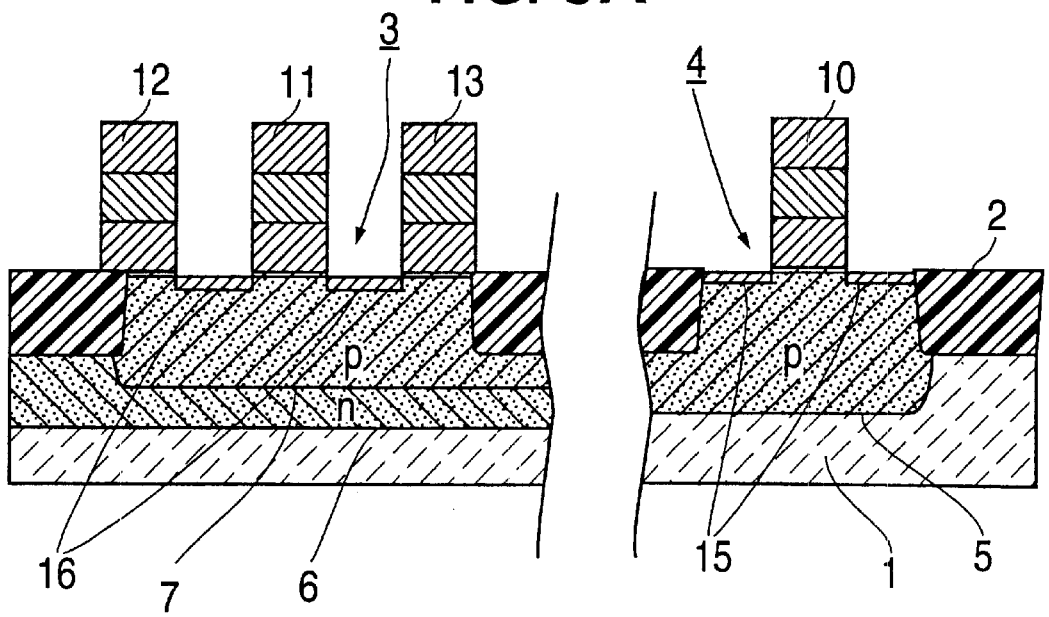
FIGS. 9A and 9B are cross-sectional views of a hybrid type semiconductor device at successive steps a and b of a fabricating process thereof, as an embodiment of the present invention.
Figure 9B:
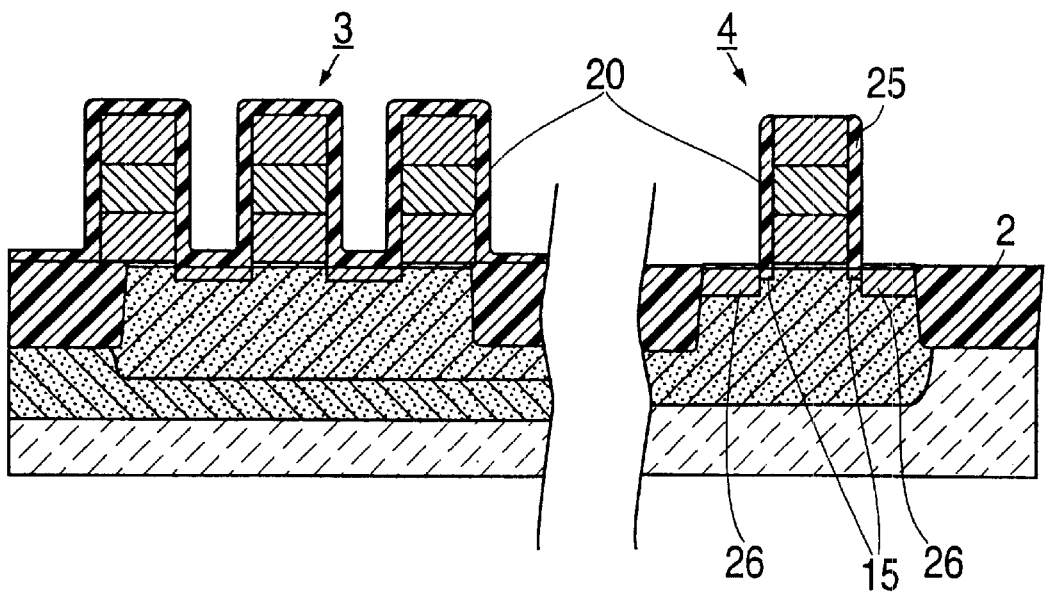

FIGS. 9A and 9B are cross-sectional views of a hybrid type semiconductor device at successive steps a and b of a fabricating process thereof, as an embodiment of the present invention.

Figure 1B:
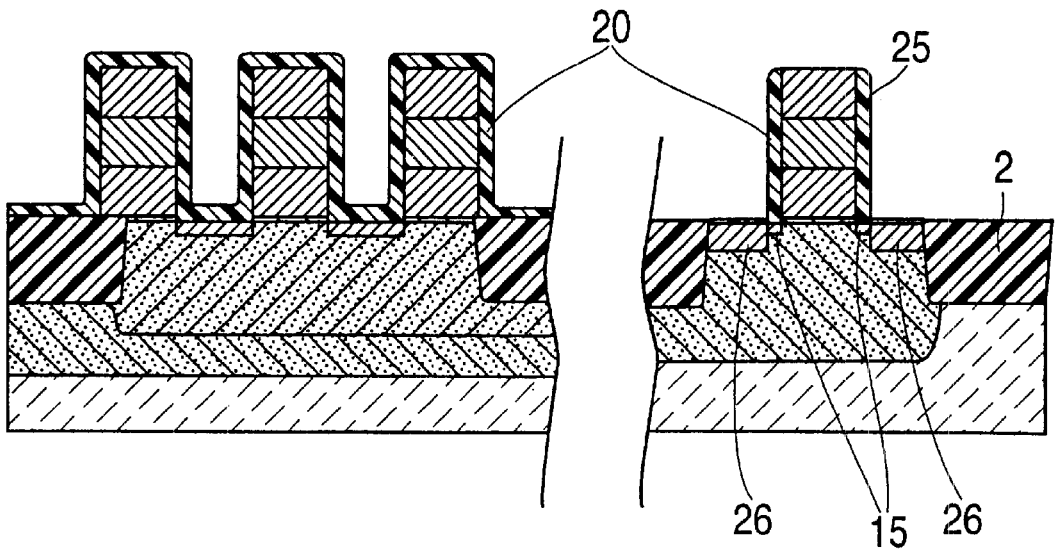
Figure 2A:
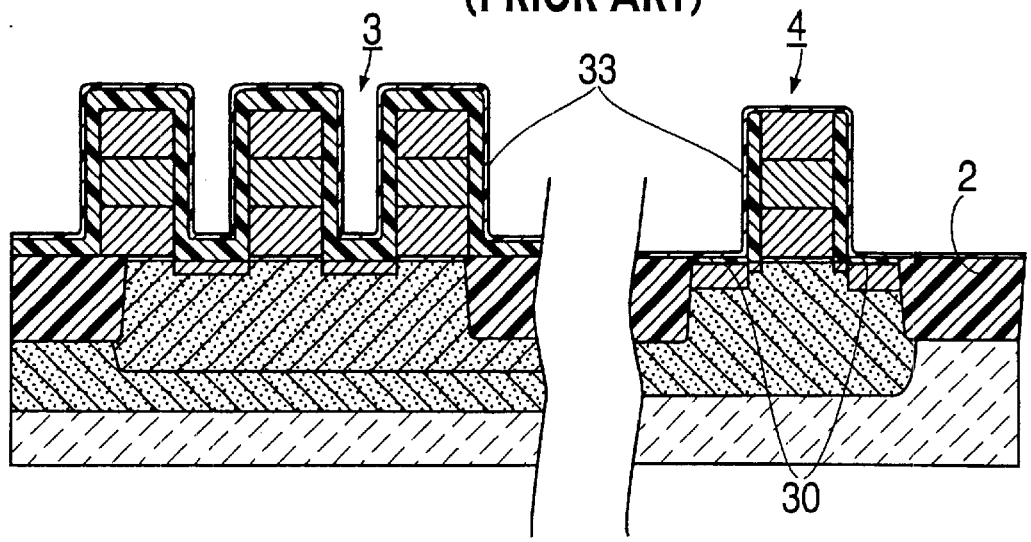
FIGS. 2A and 2B are cross-sectional views of a hybrid type semiconductor device of the related art at successive steps c and d processes of a fabricating process thereof.
Figure 2B:
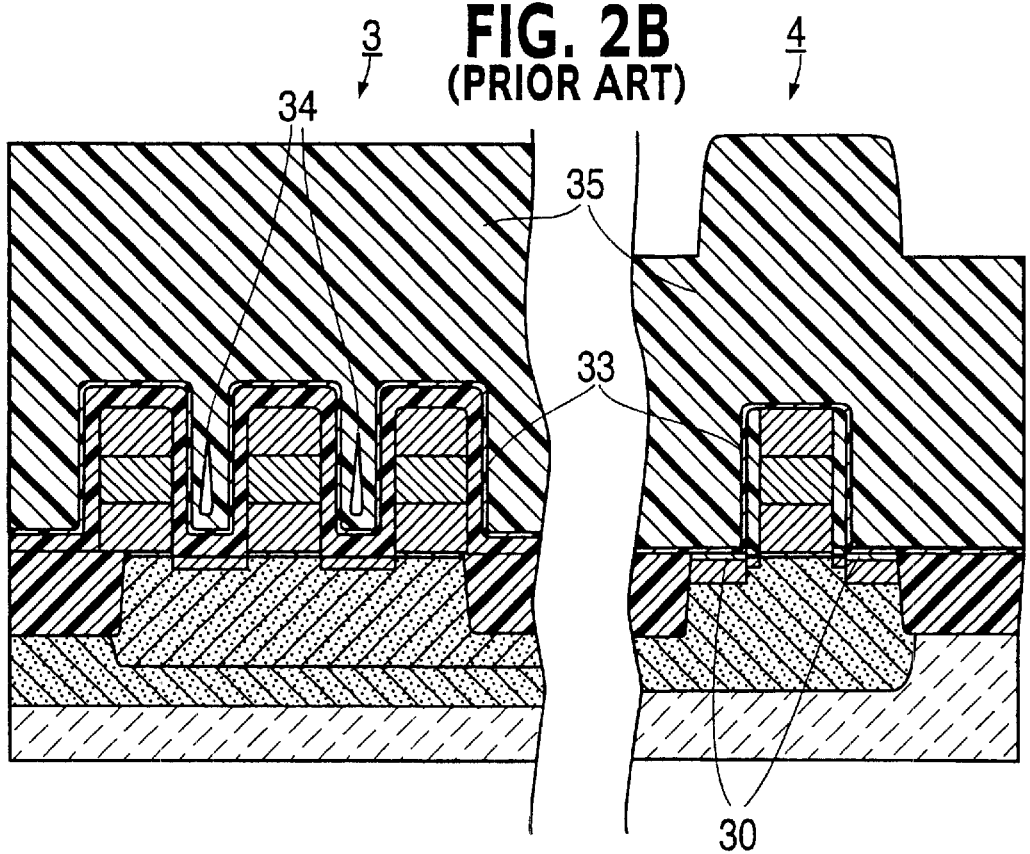
Figure 3A:
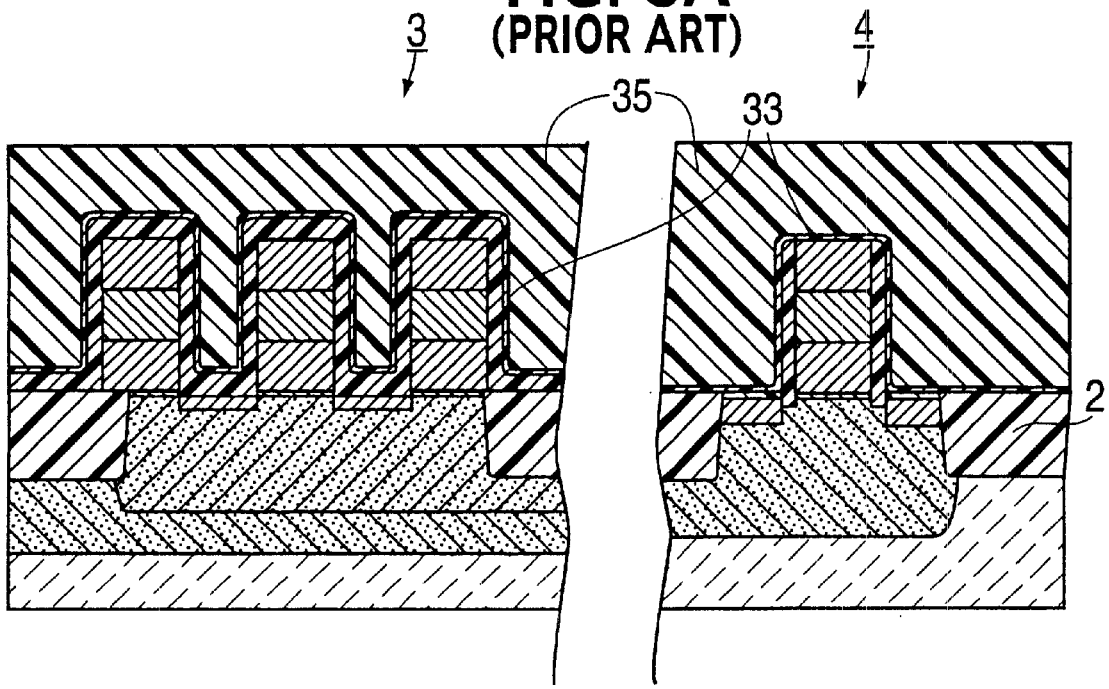
FIGS. 3A and 3B are cross-sectional views of a hybrid type semiconductor device of the related art at successive process steps e and f of a fabricating process thereof.
Figure 3B:
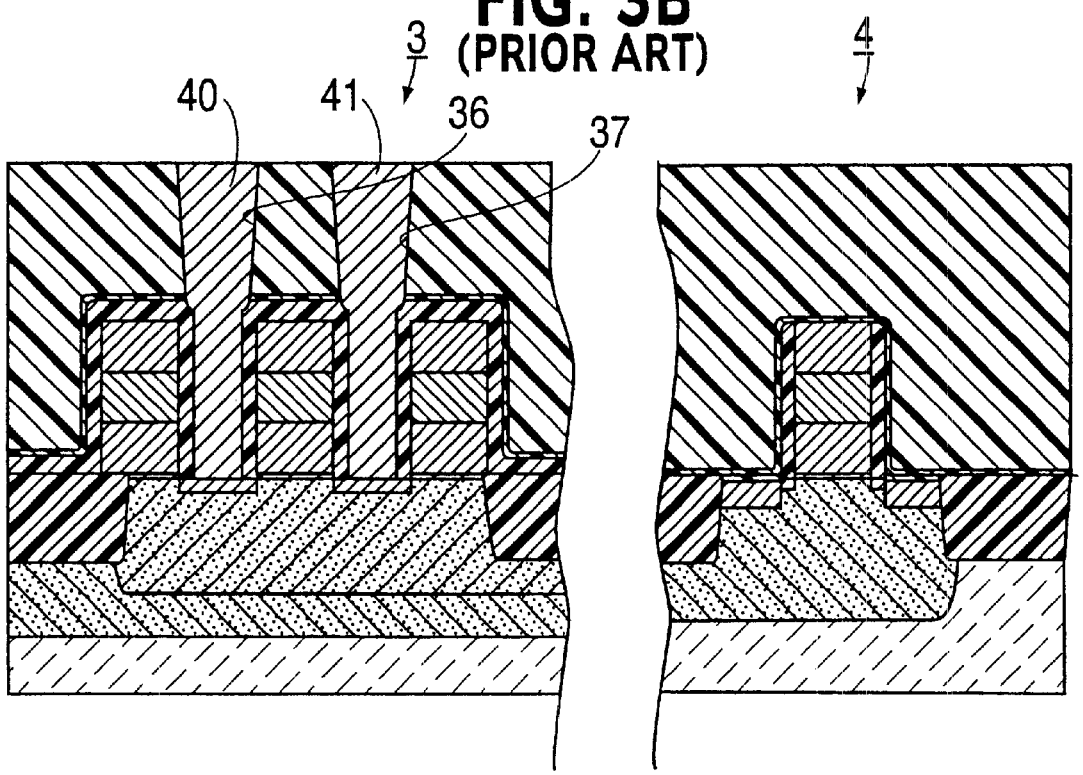
Figure 4:
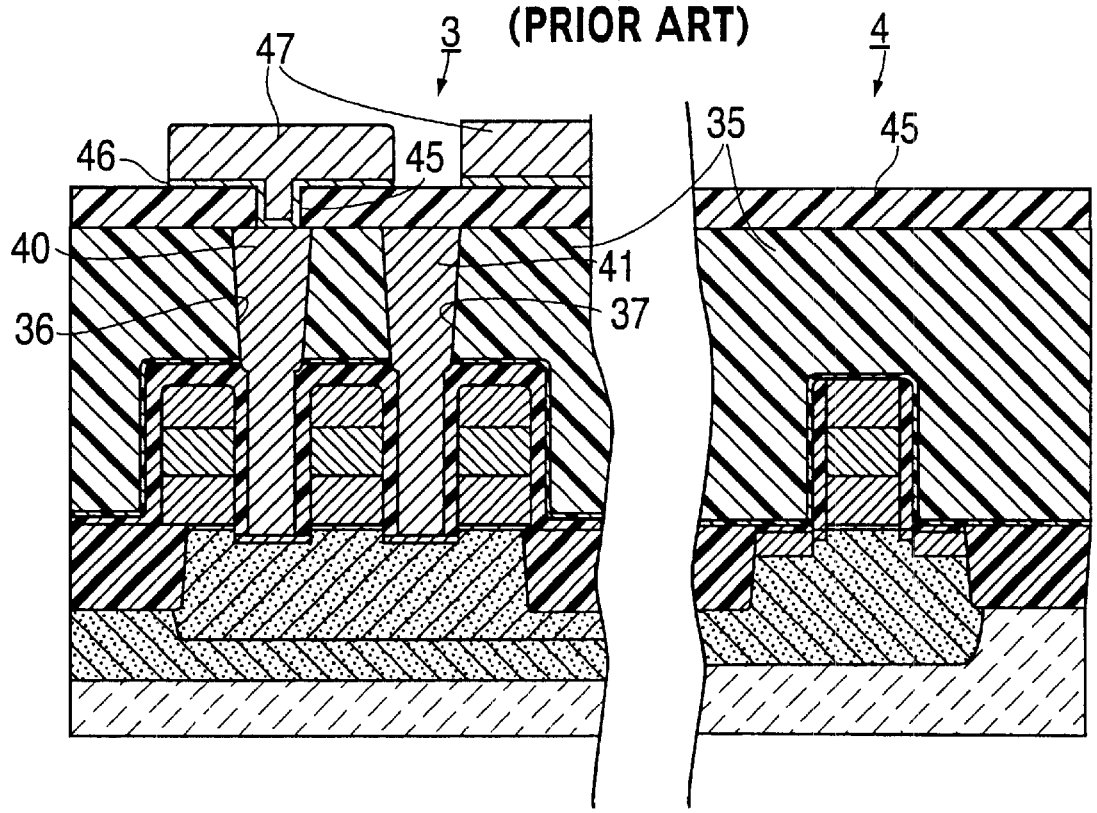
FIG. 4 is a cross-sectional view of a hybrid type semiconductor device of the related art at step g of a fabricating process thereof.
Figure 5:
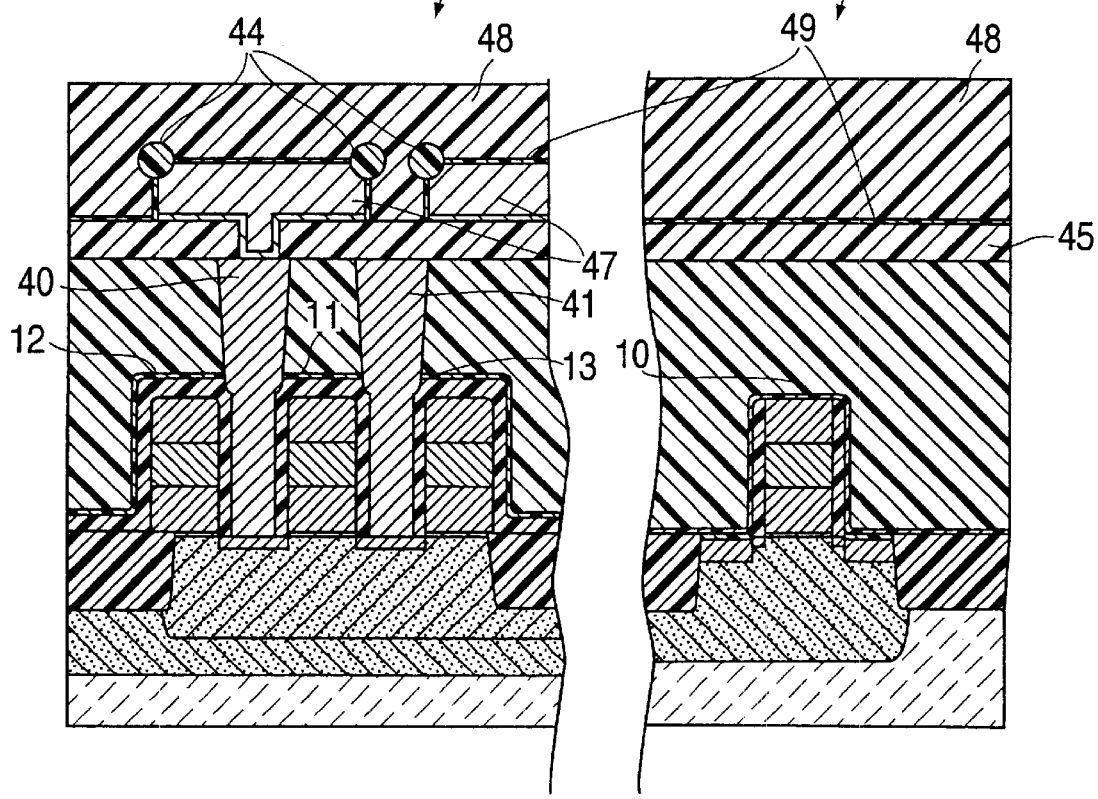
FIG. 5 is a cross-sectional view of a hybrid type semiconductor device of the related art at step h of a fabricating process thereof.
Figure 6:
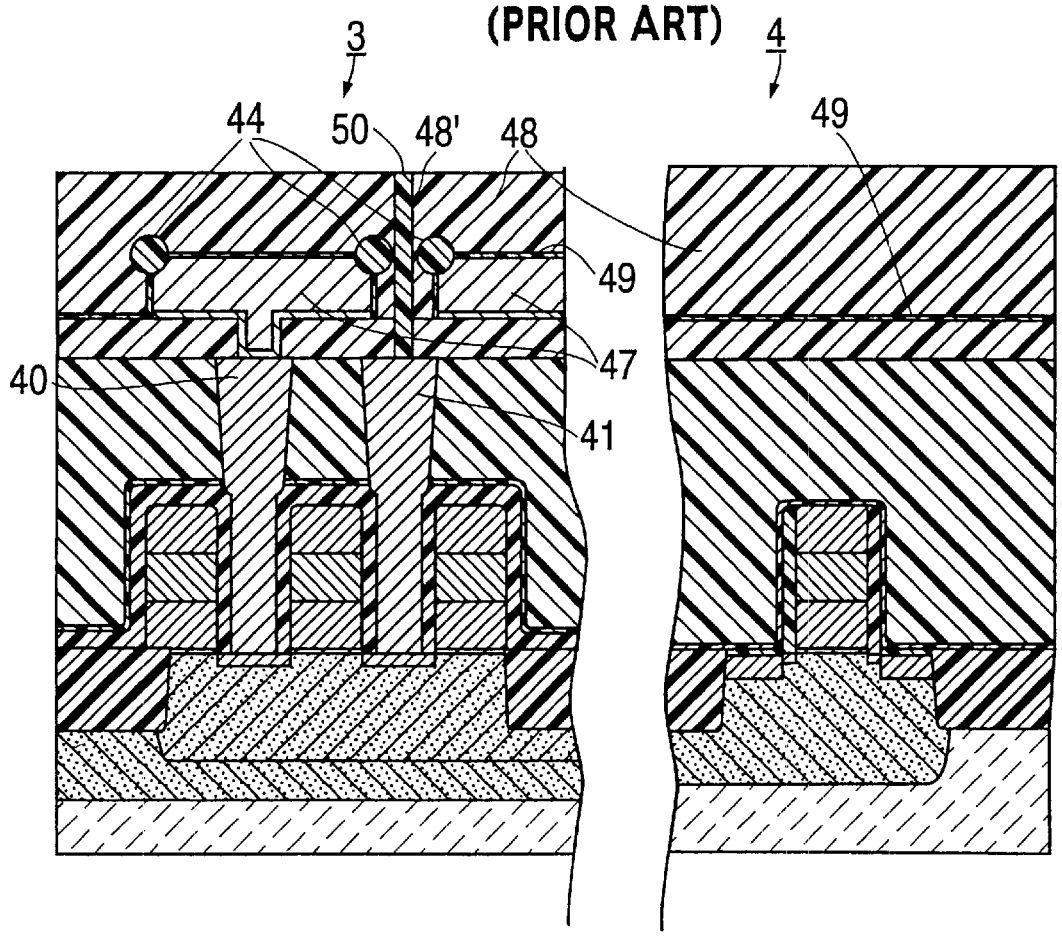
FIG. 6 is a cross-sectional view of a hybrid type semiconductor device of the related art at step i of a fabricating process thereof.
Figure 7:
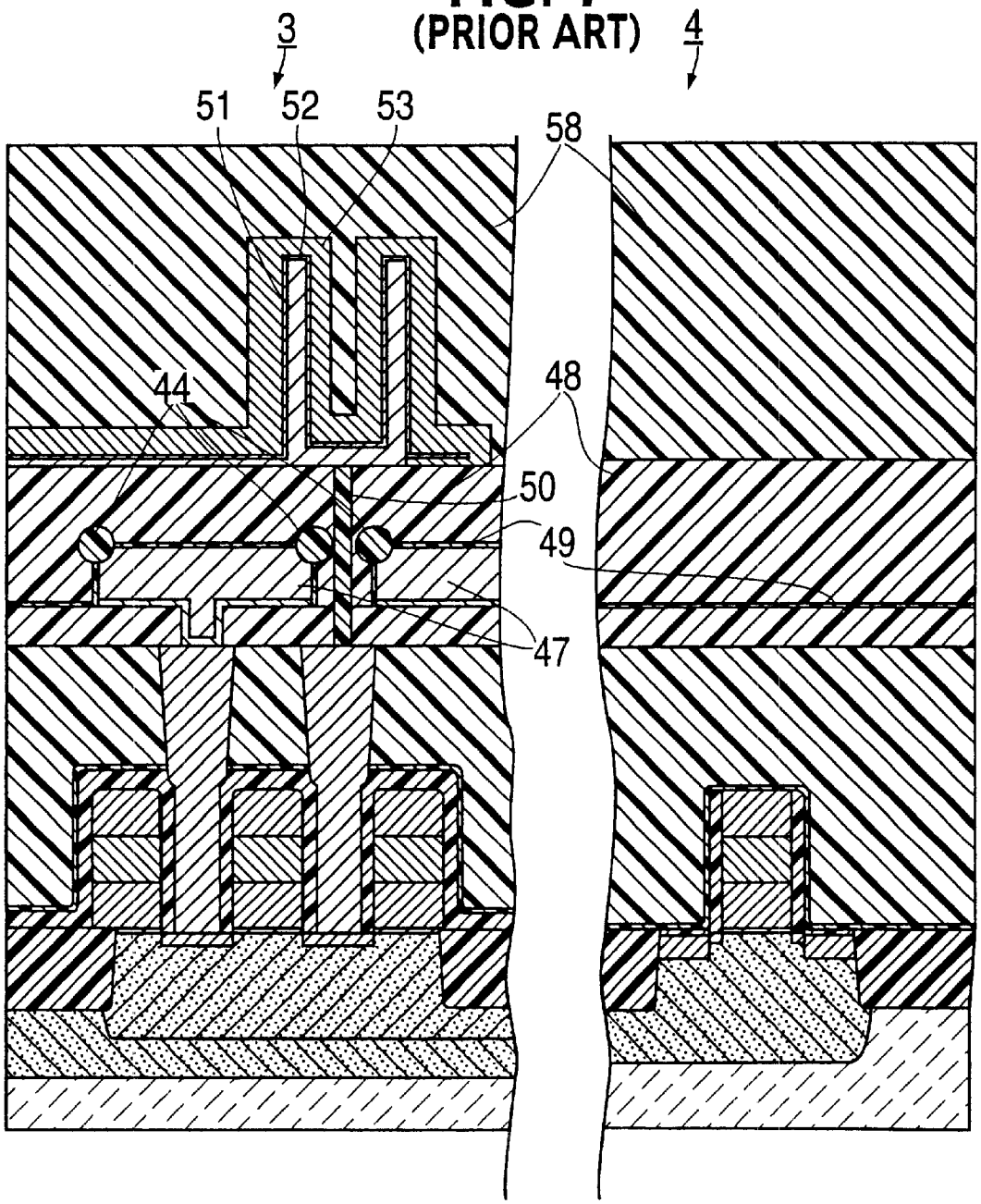
FIG. 7 is a cross-sectional view of a hybrid type semiconductor device of the related art at step j of a fabricating process thereof.
Figure 8:
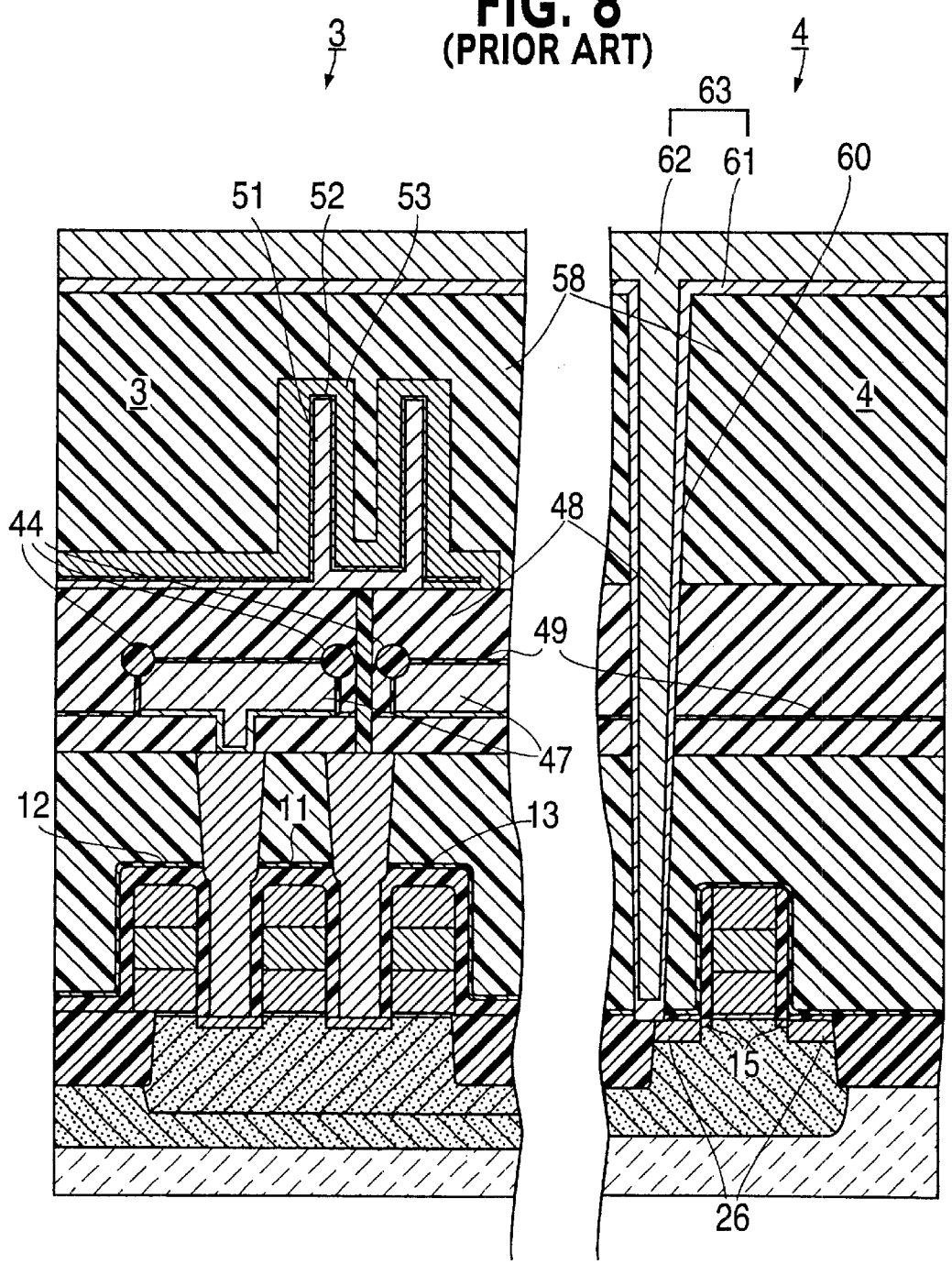
FIG. 8 is a cross-sectional view of a hybrid type semiconductor device of the related art at step k of a fabricating process thereof.

In step a and FIG. 9A, an initial thermal oxide film ("I-Ox") is grown to a thickness of 5 nm on an upper main surface of a silicon substrate 1 and, thereafter, a thermal silicon nitride film (LP-SiN) is grown to a thickness of 100 nm. Subsequently, patterning of the thermal nitride film (LP-SiN) is performed by etching, using a photoresist layer and a dry etching method. After the resist is removed with an asher, the patterned thermal silicon nitride film (LP-SiN) is used as a hard mask for trench etching of the silicon substrate 1. An etching depth is set, as an example, to 400 nm. Next, a thermal oxide film is grown to a thickness of 10 nm on the trench sidewall; then, an HDP oxide film 2 is grown to a thickness of 700 nm, to embed the Si trench part [#?]. As an example, the embedding condition of the HDP oxide film 2 is set to $SiH_4/O_2/He=150/300/325$ sccm. Thereafter, using CMP (chemical mechanical polishing), the HDP oxide film 2 on the LP-SiN film is removed to flatten the surface, using the LP-SiN film as the etch stopper, for purposes of obtaining the shallow trench isolation ("STI" or "Element Isolation Insulation") film 2. Respective, different conductive impurities are introduced at the surface of the silicon substrate 1, defined with the element isolation insulation film 2, to continuously form the p-type well 5, n-type well 6 and p-type well 7. Conforming to the case of FIG. 1, the left side illustrates the DRAM part active region 3 and the right side of the figure illustrates the logic device part active region 4. Moreover, after the polysilicon (Poly-Si) is laminated to a thickness of 100 nm, a tungsten silicide layer (WSi) of a thickness of 100 nm and a high temperature thermal oxide film (HTO) of a thickness of 100 nm are laminated sequentially; these laminated layers then are patterned with a dry etching process, using the photoresist layer as a mask, to form the gate electrode. Following the gate electrode patterning, arsenic (As) is introduced to form LDD (lightly doped drain) region 15, using the gate electrode 10 of the Logic device part 4 as a mask, to form an n-channel transistor; moreover, boron (B) ions are injected, using the DRAM part gate electrodes 11, 12, 13 as masks, for purposes of forming LDD source-drain regions 16 of a p-channel transistor. Thereby, the LDD source/drain regions 15 are formed relative to the logic device part active region 4, while the source/drain regions 16 are also formed relative to the DRAM part active region 3.

In step b and FIG. 9B, a thermal silicon nitride film (i.e., low-pressure SiN, or LP-SiN) 20 is formed to a thickness of 60 nm on the entire surface, including the surface of the gate electrodes. Next, a photoresist is formed over the entire surface and patterned by a photolithographic method to remove same from the surface of the active device 4, which is then etched. In the DRAM part 3 (in the left side of FIG. 9A), a sidewall etch-back is not performed, as a measure for preventing any electrical short-circuit being produced in the SAC (self-alignment contact) etching step, and patterning is performed using the photoresist as the mask. Thereby, the sidewall etch-back is performed only in the Logic device part 4. Therefore, the gate electrode is entirely covered with the thermal silicon nitride film 20 in the DRAM part 3; in the Logic device part 4, on the other hand, only a sidewall spacer film 25 is left on the gate electrode sidewalls. Next, using the side-wall spacer film 25 as the mask, the source/drain regions 26 are selectively formed in the Logic device part 4 by, e.g., phosphor ion implantation.

Figure 10A:
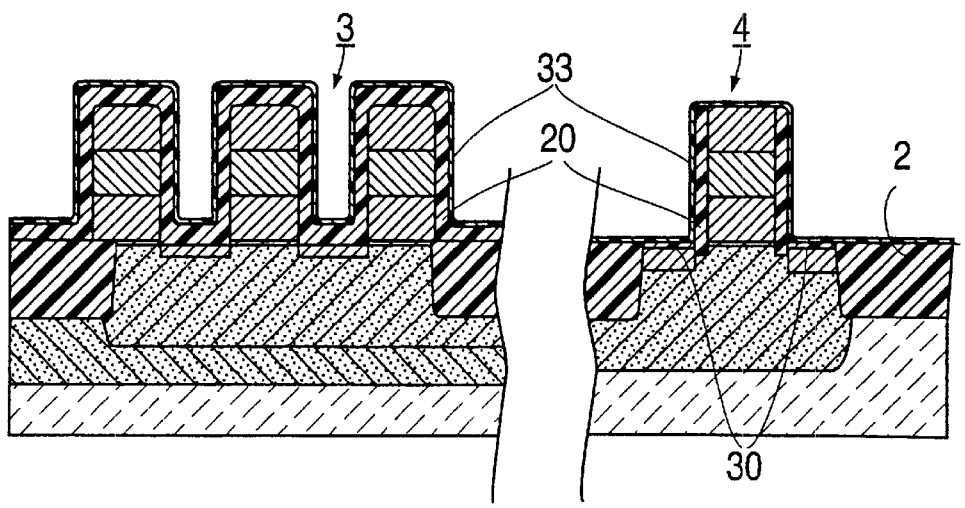
FIGS. 10A and 10B are cross-sectional views of a hybrid type semiconductor device at successive steps c and d of a fabricating process thereof, as an embodiment of the present invention.
Figure 10B:
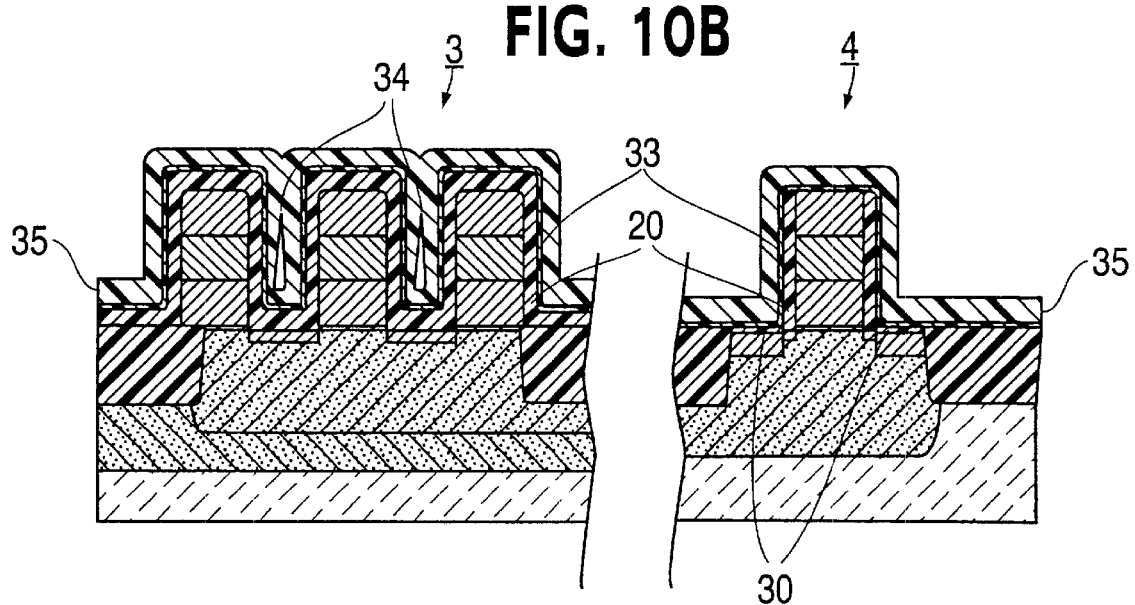

FIGS. 10A and 10B are cross-sectional views of a hybrid type semiconductor device at successive steps c and d of a fabricating process thereof, as an embodiment of the present invention.

In FIG. 10A and step c, a cobalt silicide (CoSi) film 30 is formed, first, in a thickness of 10 nm on the entire surface of substrate 1, and thus on the surface of the source/drain regions 15 of the Logic device part 4 at which the silicon substrate surface is exposed, by a sputtering method using cobalt (Co) as the target. Particularly, the cobalt silicide (CoSi) film 30 is formed through a reaction of the Co with silicon of the substrate 1, by an RTA (Rapid Thermal Annealing) process performed at under 500° C. This RTA process is performed, for example, for 30 sec. at 500° C. in an atmosphere of nitrogen ($N_2$) of 10/min. Thereafter, a thermal silicon nitride film (LP-SiN) 33 is formed to a thickness of 25 nm, serving as an etching stopper layer at the time of forming a contact window in the silicon nitride film 20, which will become the stopper film for the Self-Aligned Contact (SAC) etching of the DRAM part 3 and the cobalt silicide (CoSi) film 30. The thermal silicon nitride film (Low Pressure Silicon Nitride: "LP-SiN") 33 is formed using a vertical furnace with a gas system, or atmosphere, of $SiH_4$/$NH_3$/$N_2$ under a growth temperature of 700° C. A 25 nm thickness of the thermal silicon nitride film (LP-SiN) 33 must be of a significant thickness, e.g., 25 nm, to prevent local digging, or pit forming, by over-etching due to the fluctuation in respective thicknesses of the interlayer films. Owing to the thermal silicon nitride film (Low Pressure Silicon Nitride; LP-SiN) 33, the minimum width of the respective gaps between adjacent gate electrodes 11 to 13 in the DRAM part 3, where the sidewall etch back is not conducted, is 70 nm, for example. The aspect ratio of the gap (i.e., the depth to width ratio of a window) is 4.2 for a gate electrode height of 300 nm.

Next, in FIG. 10B step d, a BPSG film 35 of 100 nm thickness is formed for filling each such gap. The growth conditions in this case are, for example, that TEOS/TEP/TEOB=300/80/35 mgm, $O_3$/$H_3$=4000/6000 sccm, growth pressure is 600 Torr, growth temperature is 480° C., and concentrations of boron and phosphorus respectively are 4.0 wt % and 5.0 wt %. The growth rate in this case is 60 nm/min.

Figure 11:
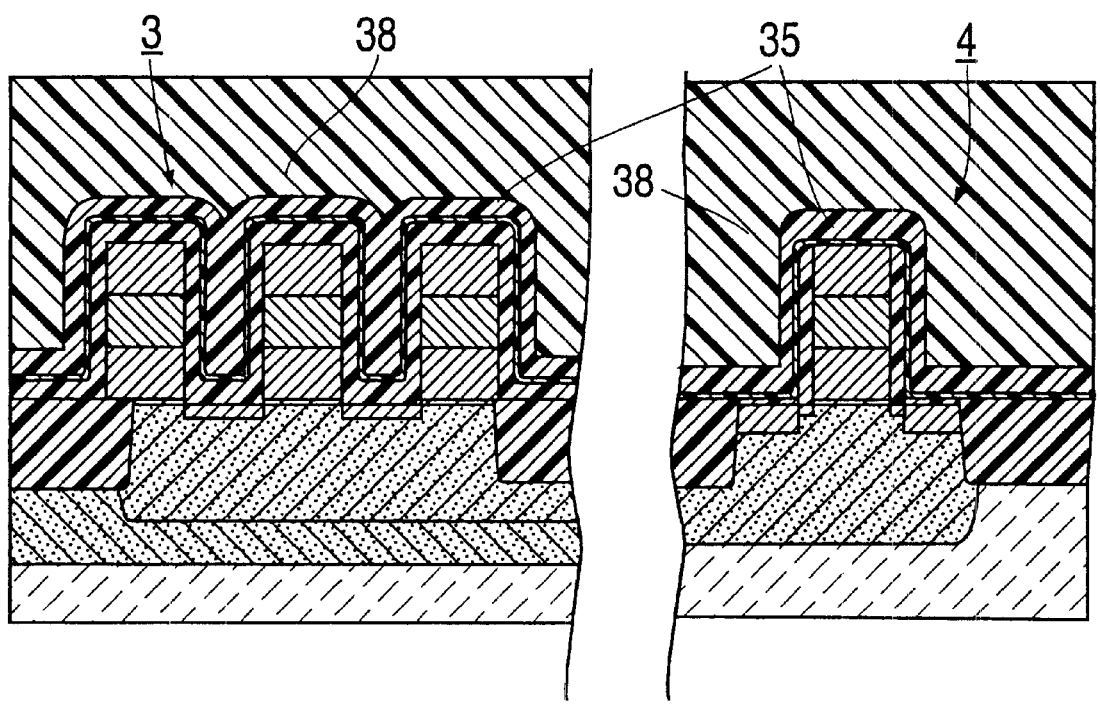
FIG. 11 is a cross-sectional view of a hybrid type semiconductor device at step e of a fabricating process thereof, as an embodiment of the present invention.

FIG. 11 is a cross-sectional view of a hybrid type semiconductor device structure, at step e of a fabricating process thereof, as an embodiment of the present invention.

In FIG. 11 and step e, a BPSG film 38 of 900 nm thickness is formed under different process conditions from those in forming BPSG film 35 (FIG. 10B). The growth conditions are, for example, that TEOS/TEP/TEOB=600/195/47 mgm, O3/H=4000/6000 sccm, growth pressure is 200 Torr, growth temperature is 480° C., and concentrations of boron (B) and phosphorus (P) respectively are 4.0 wt % and 5.0 wt %. In this situation, the growth rate is 350 nm/min.

Under these conditions, voids 34 (FIG. 10B) at both sides of the gate, at the time of growth, remain (not shown in FIG. 11). A reflow heating process is performed for 20 min under a vapor atmosphere of 700° C. using a conventional furnace. Preferably, the reflow heat treatment is performed using a vertical type diffusion furnace under the conditions that hydrogen ($H_2$) is supplied at 10 l/min and oxygen ($O_2$) is supplied at 5 l/min, in a water vapor ($H_2O$) atmosphere at 700° C. using pyrogenic. As a result of the reflow heating process, the material in the gap surrounding the voids is bonded together, eliminating the voids. Moreover, a concentration, of a total amount of boron (B) and phosphorus (P), is set to 24 mol %, or more, in order to generate the reflow in the low temperature region. If the film formation property in the step d to form the BPSG film 35 is the voids become large and cannot be eliminated, even by controlling pertinent process parameters. With a later CMP process (chemical mechanical polishing), the surface is flattened and thereby the structure illustrated in FIG. 11 can be formed.

Figure 18:
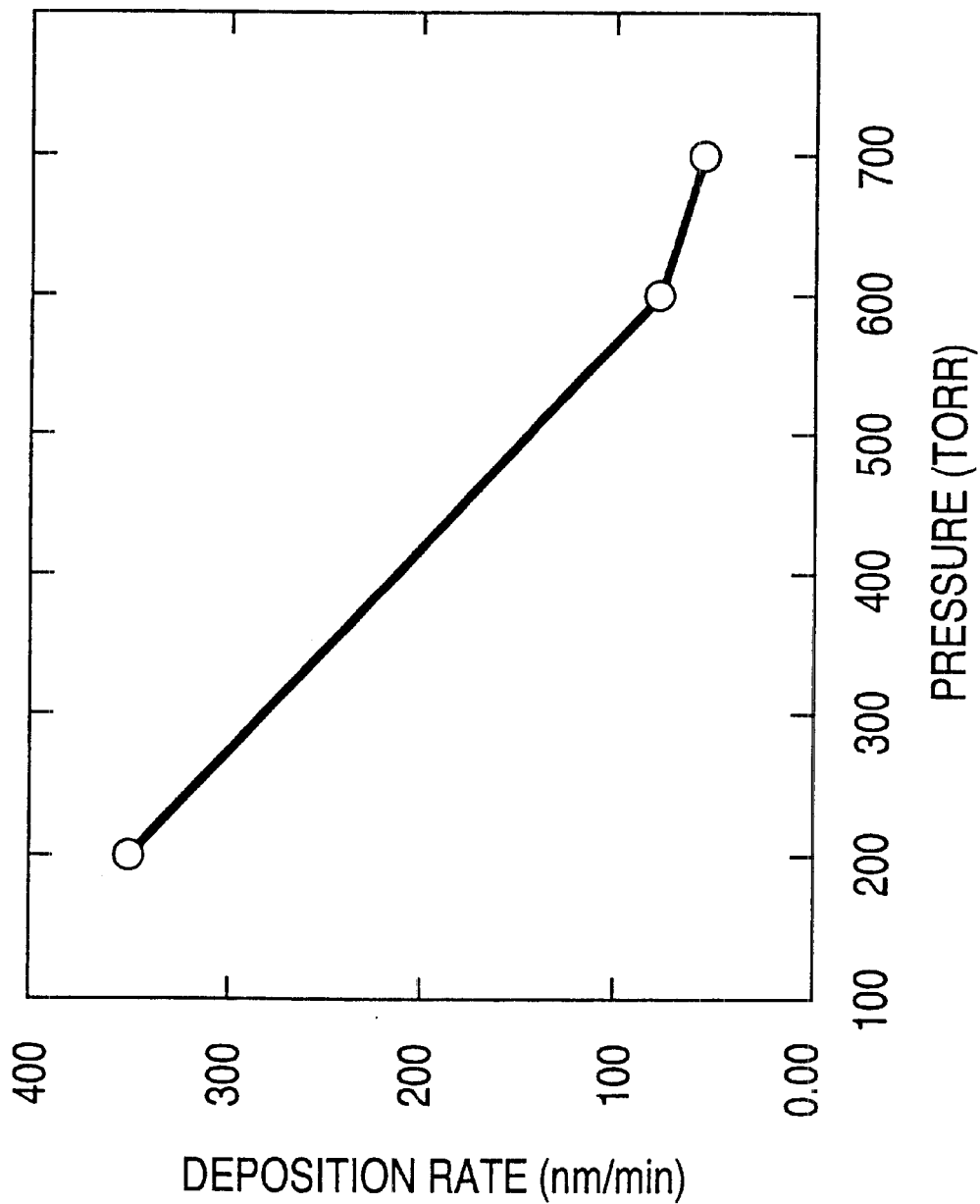
FIG. 18 is a plot of the relationship between a level of pressure during formation of a BPSG film and a film deposition rate (milimeters per minute) during formation of the film by a thermal CVD method.

FIG. 18 is a plot of the relationship between pressure levels and film deposition rates (milimeters per minute), during formation of BPSG film by a thermal CVD method. Particularly, the gas pressure (Torr) during film formation is plotted on the horizontal axis and the deposition rate (nm/min.) is plotted on the vertical axis. As illustrated in FIG. 18, the film formation rate increases (i.e., is higher) as the pressure is reduced (i.e., is lower) and thus the formation rate tends to become low under a higher-pressure condition. However, the film formation rate changes by only a relatively small amount as the pressure increases above 600 Torr. Since the increase or decrease of the film formation rate has an inverse relationship to the size of the voids, a relationship, similar to that in the graph of FIG. 18, exists between the size of the voids, plotted on the vertical axis (i.e., void size increases in the upper part of the vertical axis and decreases in the lower part of the vertical axis), and pressure, as plotted on the horizontal axis.

Figure 12A:
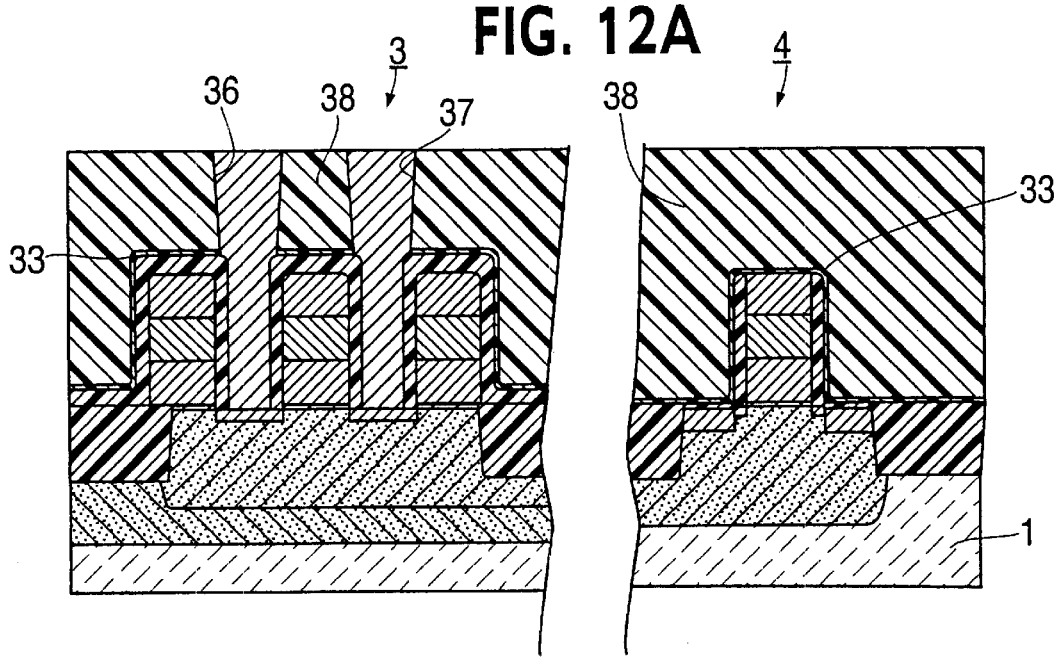
FIGS. 12A and 12B are a cross-sectional views of a hybrid type semiconductor device at successive steps f and g of a fabricating process thereof, as an embodiment of the present invention.
Figure 12B:
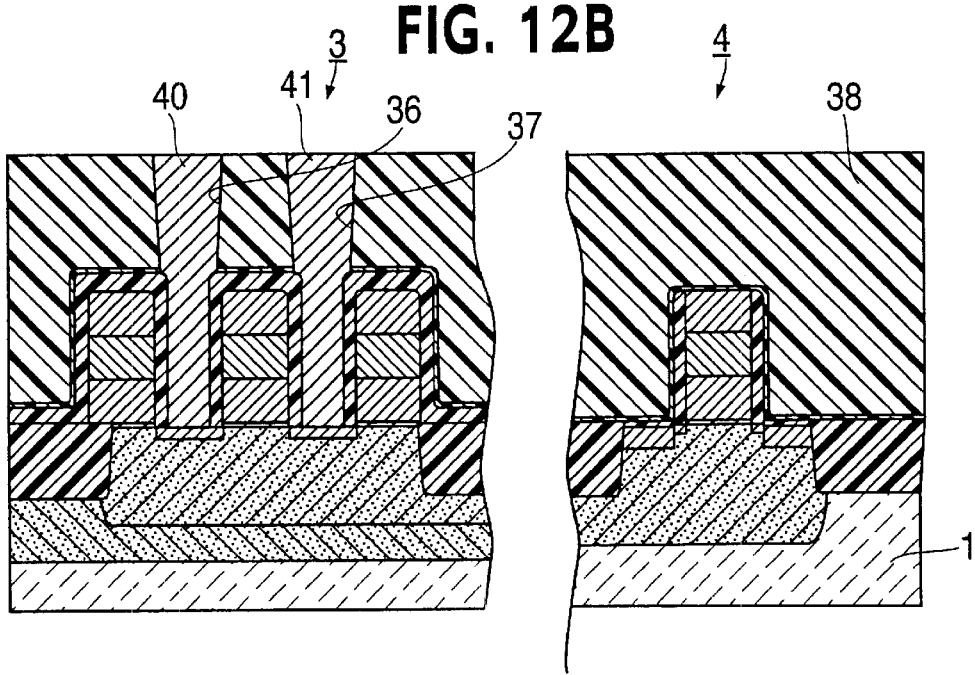

FIGS. 12A and 12B are cross-sectional views of a hybrid type semiconductor device at successive steps f and g of a fabricating process thereof, as an embodiment of the present invention.

In step f and FIG. 12A, a photoresist (not shown) is formed by coating on the flat surface of the BPSG film 38. This photoresist is patterned by a well-known photolithographic method, and is then used as a mask to open the contact windows 36, 37, only in the DRAM part 3, employing dry etching using the silicon nitride film (SiN) 33 as the stopper.

In step g and FIG. 12B, conductive polysilicon (Poly Si) is embedded within the contact windows 36, 37 using the CVD method, forming polysilicon pugs 40, 41 in electrical contact with the substrate 1. The conductive polysilicon is formed, in a single step, in a sufficient thickness to embed (i.e., fill) the contact windows 36, 37; thereafter, it is etched back by a CMP (chemical mechanical polishing) process to complete the formation of the polysilicon plugs 40, 41 with exposed surfaces thereof continuous, or flush, with the surface of the BPSG film 38.

Figure 13:
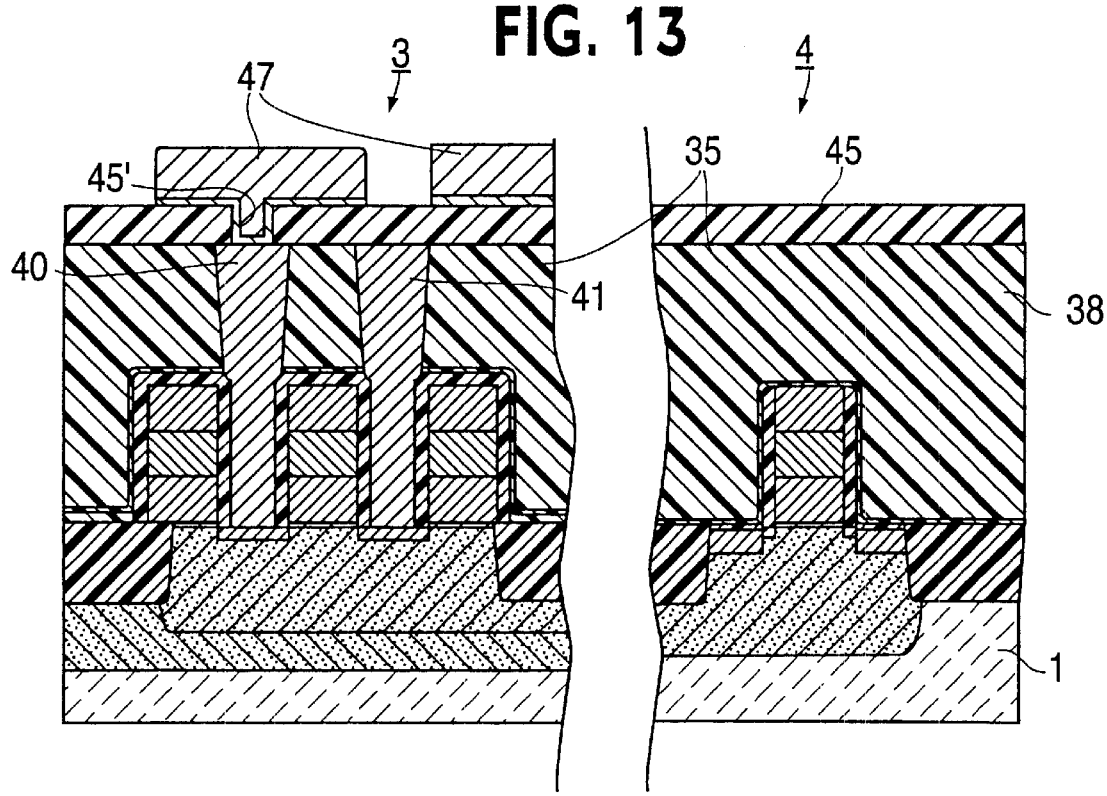
FIG. 13 is a cross-sectional view of a hybrid type semiconductor device at step h of a fabricating process thereof, as an embodiment of the present invention.

FIG. 13 is a cross-sectional view of a hybrid type semiconductor device at step h of a fabricating process thereof, as an embodiment of the present invention.

In step h and FIG. 13, a silicon oxide film 45 is formed on the entire surface of the structure resulting from the processes explained above, using a plasma CVD (chemical vapor deposition) method. Film 45 is required to have a film stress of $-1.5\_\sim 10^9$ dins/cm$^2$ or less and a refractive index of 1.5 or more in order to control generation of bubbles, produced as a fault of the BPSG film. The growth conditions are, for example, that SiH$_4$ is 154 cc/min, N$_2$ is 3800 cc/min, N$_2$O is 3800 cc/min, 400 kHz LF power is 90W, 13.56 MHz HF power is 300W, growth pressure is 1.6 Torr and growth temperature is 400° C.

Thereafter, a contact window 45' is formed through the silicon oxide film 45 for electrical connection with the polysilicon plug 40, using the resist mask. Thereafter, a titanium (PVD-Ti) layer of 20 nm thickness is formed by a sputtering method, a titanium nitride (CVD-TiN) layer of 20 nm thickness and a tungsten (W) layer of 100 nm thickness are formed by a CVD method and a silicon oxide nitride film (ARC-SiON) of 60 nm thickness, formed as the reflection preventing film, are sequentially laminated. Thereafter, the composite of the laminated layers is patterned by a dry etching method, using a resist mask, to form a bit line 47.

Figure 14:
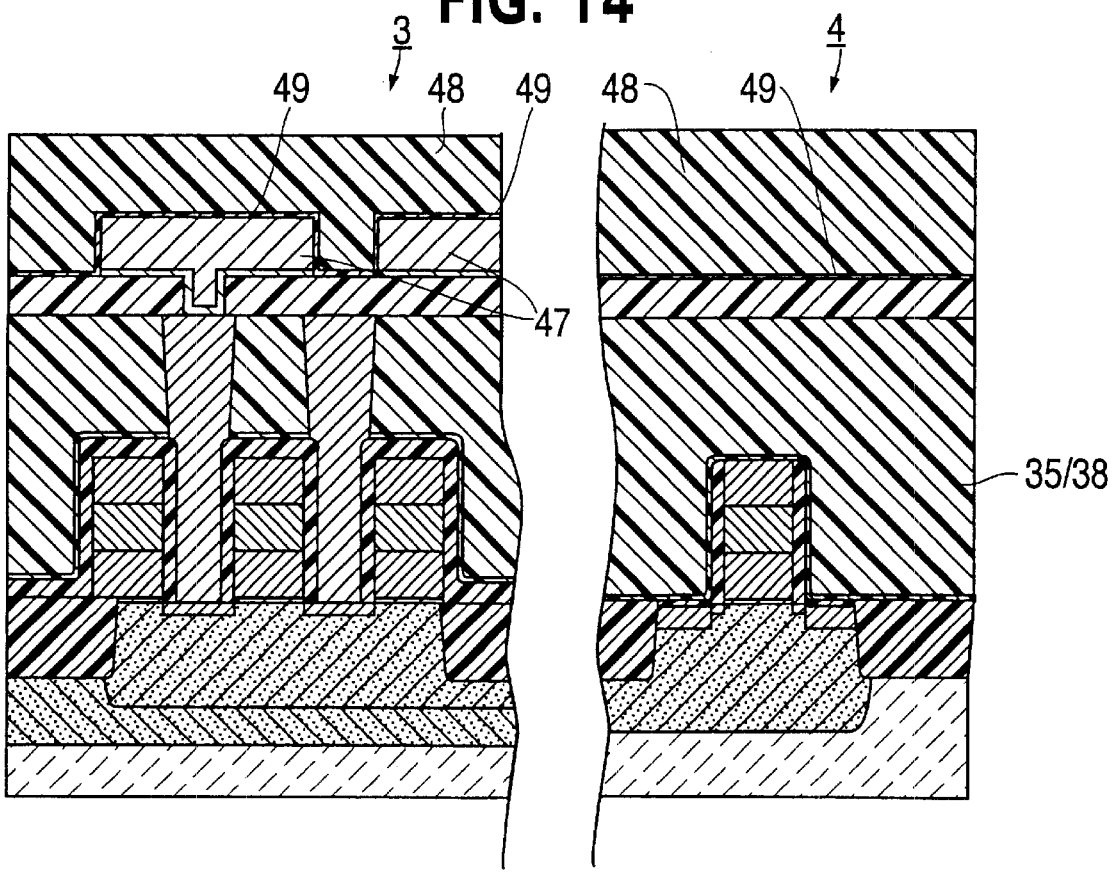
FIG. 14 is a cross-sectional view of a hybrid type semiconductor device at step i of a fabricating process thereof, as an embodiment of the present invention.

FIG. 14 is a cross-sectional view of a hybrid type semiconductor device at step i of a fabricating process thereof, as an embodiment of the present invention.

In step i and FIG. 14, an RTA (Rapid Thermal Annealing) process is performed for 60 sec. in a nitrogen atmosphere of 800° C. or lower, to form a thermal silicon nitride film (LP-SiN) 49 of 5 nm thickness, on the titanium (Ti) and tungsten (W) surface of the bit line 47. Thereafter, a silicon oxide film 48 of 750 nm thickness is formed using a high-density plasma. The growth conditions are that SiH$_4$ is 99 cc/min, O$_2$ is 237 cc/min, 400 kHz source power is 4400W and 13.56 MHz, substrate bias power is 2500W, and growth temperature is 450° C.

Figure 15:
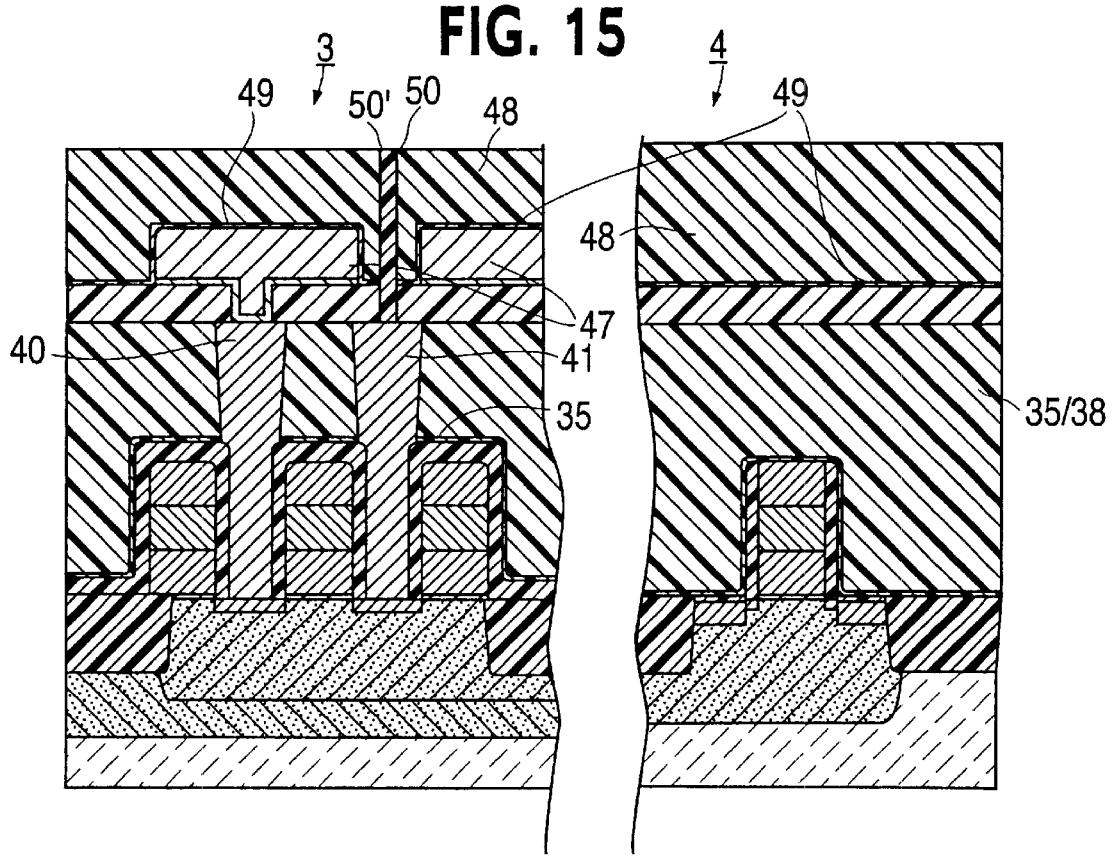
FIG. 15 is a cross-sectional view of a hybrid type semiconductor device at step j of a fabricating process thereof, as an embodiment of the present invention.

FIG. 15 is a cross-sectional view of a hybrid type semiconductor device at step j of a fabricating process thereof, as an embodiment of the present invention.

In step j and FIG. 15, the silicon oxide film 48 is etched by a dry etching method, using a photoresist as a mask, to open therein a contact window 50' for a polysilicon (poly Si) plug 50. The poly Si plug 50 is embedded in the contact window 50' by a CVD method and provides for electrical connection with the lower polysilicon plug 41. For this purpose, polysilicon is deposited in a single step in a sufficient thickness to more than completely fill the contact window 50' and, thereafter, any excess top portion is removed, using CMP (chemical mechanical polishing), to form the plug 50 having a surface flush with the top surface of the (plasma) silicon oxide film 48.

Figure 16:
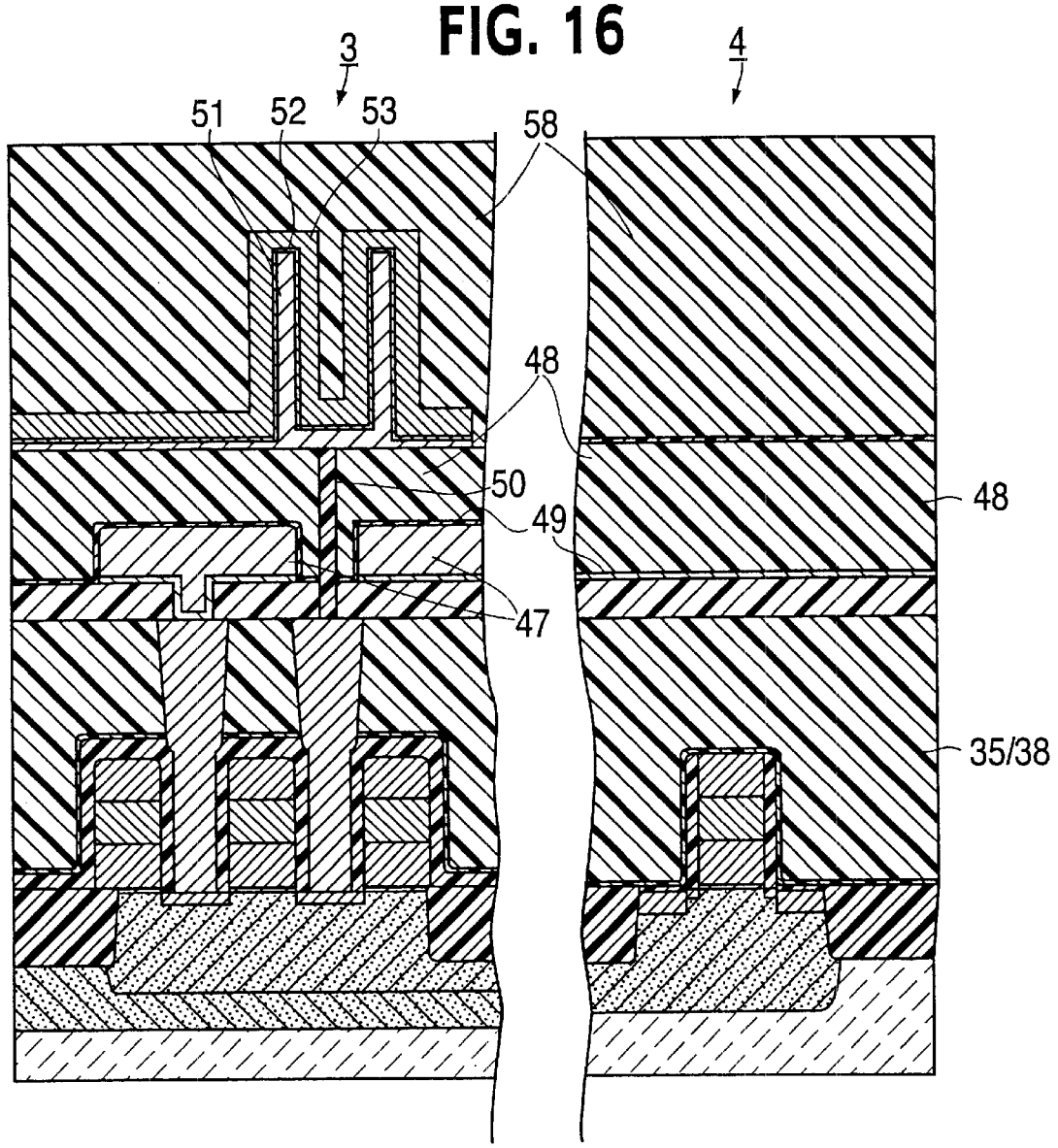
FIG. 16 is a cross-sectional view of a hybrid type semiconductor device at step k of a fabricating process thereof, as an embodiment of the present invention.

FIG. 16 is a cross-sectional view of a hybrid type semiconductor device at step k of a fabricating process thereof, as an embodiment of the present invention.

In step k and FIG. 16, a storage electrode 51, a dielectric material film 52 and an opposing electrode 53 are sequentially formed, through patterning, to form a cell capacitor structure. The forming sequence is identical to that in the related art in this case. Thereafter, the silicon oxide film 58 is formed in a 2000 nm thickness by a CVD method using a high-density plasma. The growth conditions are that SiH$_4$ is 99 cc/min, O2 is 237 cc/min, 400 kHz source power is 4400W, 13.56 MHz, substrate bias power is 2500W and a growth temperature is 450° C.

Figure 17:
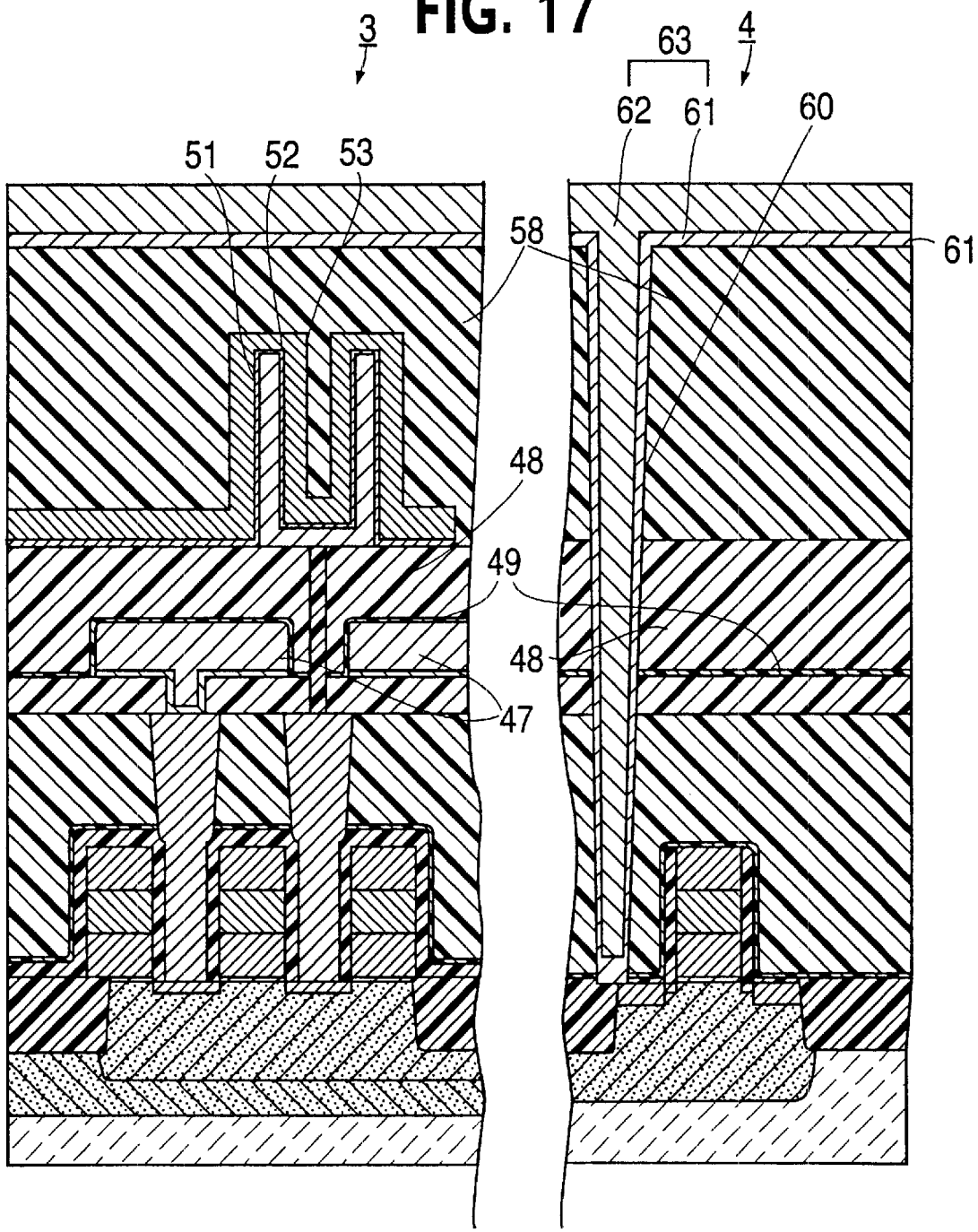
FIG. 17 is a cross-sectional view of a hybrid type semiconductor device at step l of a fabricating process thereof, as an embodiment of the present invention.

FIG. 17 is a cross-sectional view of a hybrid type semiconductor device at step l of a fabricating process thereof, as an embodiment of the present invention.

In step l and FIG. 17, a deep contact window 60 is opened for forming an electrical connection with the substrate. This contact window 60 can be opened employing an RIE (Reactive Ion Etching) method. Thereafter, a thin barrier metal layer 61 is formed in such a manner that it extends on the interior side and bottom walls of the window 60 and on the upper surface of the silicon oxide film 58 extending from the contact window 60. Thereafter, a tungsten (W) layer 62 is formed in a thickness sufficient to fill, completely, the window 60. The laminated structure of the barrier metal layer 61 and tungsten (W) layer 62 is used as the conductive plug 63.

Boron (B) and phosphorus (P), included as dopants, or impurities, in the BPSG film, respectively exist therein in the form of B$_2$O$_3$ and P$_2$O$_5$. A physical mechanism, which exists when the BPSG film 35/38 reflows at a lower temperature, depends on the event that the BPSG film structure is deflected and easily decoupled at a lower temperature because such impurities exist in the film. Accordingly, the reflow temperature is lowered due to the inclusion of boron and phosphorus atoms. In case of filling a gap having an aspect ratio of 4 or larger, in accordance with the present invention, and when it is assumed that the film formation is performed under a condition of a water vapor atmosphere of 700° C., a concentration of boron B) of 3.7 wt % and of phosphorus (P) of 4.7 wt % or more is required; alternatively, if mol % is used in place of wt % as the index of reflow, the total impurity concentration becomes 24 mol % through the conversion explained above.

An embodiment of the present invention has been explained above. However, the present invention is not limited to the above embodiment and, instead, allows and encompasses various changes or modifications in conditions and material seeds used in the fabricating processes explained above. For example, a hybrid device including DRAM and logic active regions is discussed as a representative embodiment for disclosure purposes; however, the invention can also be applied to a hybrid device including a flash memory and logic devices. Further, similar effects can be achieved by applying the invention to forming a hybrid device including a plurality of logic blocks in different design sizes. Moreover, even in case of a discrete DRAM or logic device or flash memory or FRAM, the same, similar such effects can also be obtained.

According to the method of the present invention, continuous growth of an insulation film, including a conductive impurity to fill and cover a gap of high aspect ratio, of 4 or larger, provided on an active region on a substrate, is performed using a thermal CVD method having continuous supply of a film forming gas, under a pressure condition that the pressure first is high and then is lowered later, avoiding formation of a boundary layer and which otherwise would result in removal of the film; further, the gap may be filled without voids therein, as desired, even if a lengthy reflow annealing step is not performed. Thereby, adverse effects such as thermal stress, unwanted impurity diffusion or the like into the active region, and other factors adversely affecting the element may be avoided, improving fabricating yield and increasing reliability of fine devices.

What is claimed is:

1. A method of fabricating a semiconductor device having elements projecting from a main surface of a substrate, comprising:

(1) forming a first insulation film, including silicon and oxygen, on the main surface of the substrate and filling a gap between adjacent, first and second projecting elements;

(2) forming a contact window through said first insulation film to provide a substrate contact;

(3) forming a contact electrode within said contact window;

(4) forming a second insulation film, including silicon and nitrogen, on both said contact electrode and said first insulation film;

(5) forming an electrode, comprising a refractory metal, on said second insulation film; and (6) forming a third insulation film, including silicon and oxygen, on both said contact electrode and said second insulation film by a high-density plasma Chemical Vapor Deposition process employing a growth gas and excluding any inert gas.

2. A method of fabricating a semiconductor device as claimed in claim 1, wherein each of said first and second projecting elements comprises a gate electrode, each gate electrode having a gate electrode side wall and a conductive layer.

3. A method of fabricating a semiconductor device as claimed in claim 1, wherein said first insulation film comprises a Boro-Phospho-Silicate Glass (BPSG) film.

4. A method of fabricating a semiconductor device as claimed in claim 2, wherein said first insulation film comprises a Boro-Phospho-Silicate Glass (BPSG) film.

5. A method of fabricating a semiconductor device as claimed in claim 1, wherein the second insulation film is a silicon-rich plasma oxide film having a stress of $-1.5 \times 10^9$ dyns/cm$^2$ or more and a refraction index of 1.5 or more.

6. A method of fabricating a semiconductor device as claimed in claim 2, wherein the second insulation film is a silicon-rich plasma oxide film having a stress of $-1.5 \times 10^9$ dyns/cm$^2$ or more and a refraction index of 1.5 or more.

7. A method of fabricating a semiconductor device as claimed in claim 3, wherein the second insulation film is a silicon-rich plasma oxide film having a stress of $-1.5 \times 10^9$ dyns/cm$^2$ or more and a refraction index of 1.5 or more.

8. A method of fabricating a semiconductor device as claimed in claim 1, wherein step (5) of forming an electrode further comprises:

depositing a layer of the refractory metal on said second insulation film;

etching the deposited refractory metal layer to form the electrode; and subjecting the formed electrode to rapid thermal annealing in a nitrogen atmosphere and at a temperature of 800° C. or lower.

9. A method of fabricating a semiconductor device as claimed in claim 2, wherein step (5) of forming an electrode further comprises:

depositing a layer of the refractory metal on said second insulation film;

etching the deposited refractory metal layer to form the electrode; and subjecting the formed electrode to rapid thermal annealing in a nitrogen atmosphere and at a temperature of 800° C. or lower.

10. A method of fabricating a semiconductor device as claimed in claim 8, wherein step (5) of forming an electrode further comprises:

depositing a layer of the refractory metal on said second insulation film;

etching the deposited refractory metal layer to form the electrode; and subjecting the formed electrode to rapid thermal annealing in a nitrogen atmosphere and at a temperature of 800° C. or lower.

11. A method of fabricating a semiconductor device as claimed in claim 8, further comprising, after etching, performing a post-etching process prior to the rapid thermal annealing processing.

12. A method of fabricating a semiconductor device as claimed in claim 11, wherein the post-etching process comprises washing the formed electrode and exposed portions of the second insulation film with one or more chemicals or water.

13. A method of fabricating a semiconductor device as claimed in claim 1, wherein:

said semiconductor device comprises a memory device region and a logic device region; and each of said first and second insulation films is formed on, and so as to cover completely, both said memory device region and said logic device region.

* * * * *